United States Patent
Petti et al.

(10) Patent No.: US 12,544,499 B2
(45) Date of Patent: Feb. 10, 2026

(54) EXTRACORPOREAL BLOOD DISINFECTION SYSTEMS AND METHODS

(71) Applicant: RADIATRIC INC, East Durham, NY (US)

(72) Inventors: Stephen J. Petti, East Durham, NY (US); Jorel Lalicki, Troy, NY (US); Samn Raffaniello Petti, East Durham, NY (US); Ronald Tribble, Washougal, WA (US)

(73) Assignee: RADIATRIC INC, Washougal, WA (US)

( * ) Notice: Subject to any disclaimer, the term of this patent is extended or adjusted under 35 U.S.C. 154(b) by 564 days.

(21) Appl. No.: 17/737,669

(22) Filed: May 5, 2022

(65) Prior Publication Data
US 2022/0257846 A1 Aug. 18, 2022

Related U.S. Application Data

(63) Continuation of application No. PCT/US2020/070755, filed on Nov. 6, 2020.
(Continued)

(51) Int. Cl.
*A61M 1/36* (2006.01)
*A61L 2/00* (2006.01)
(Continued)

(52) U.S. Cl.
CPC ......... *A61M 1/3681* (2013.01); *A61L 2/0047* (2013.01); *A61L 2/0052* (2013.01);
(Continued)

(58) Field of Classification Search
CPC ............... A61L 2/0047; A61L 2/0052; A61M 1/3472–3496; A61M 1/3621; A61M 1/3681; A61M 1/36–387
(Continued)

(56) References Cited

U.S. PATENT DOCUMENTS 4,831,268 A * 5/1989 Fisch ................... A61M 1/3681
250/435
4,968,483 A * 11/1990 Muller ................ A61M 1/3681
250/504 R
(Continued)

FOREIGN PATENT DOCUMENTS

CN 1736496 A 2/2006
CN 101559257 A 10/2009
(Continued)

OTHER PUBLICATIONS

NASA. Visible Light. NASA, [online], [retrieved on Dec. 31, 2024]. Retrieved from the Internet <URL: https://science.nasa.gov/ems/09_visiblelight/>.*

(Continued)

*Primary Examiner* — Nicholas J. Weiss
*Assistant Examiner* — Linnae E. Raymond
(74) *Attorney, Agent, or Firm* — Heslin Rothenberg Farley & Mesiti P.C.

(57) ABSTRACT

Selective extracorporeal blood disinfection systems and related methods are disclosed. The systems comprise an input tube forming a flowpath for the flow of infected blood. The systems further comprise a disinfection unit comprising a microbicidal light emitting device configured to emit visible light within the range of about 380-425 nm and/or about 500-700 nm, and a treatment flowpath in communication with the input tube that is substantially transparent to the emitted light of the microbicidal light emitting device for receiving at least a portion of the flow of the infected blood therethrough. The microbicidal light emitting device effectuates a dose of the emitted light to the infected blood flowing through the treatment flowpath to disinfect the blood. The systems also comprise an output tube in fluid communication with the treatment flowpath forming a flow- (Continued)

path for the flow of the disinfected blood from the disinfection unit.

25 Claims, 15 Drawing Sheets

Related U.S. Application Data

(60) Provisional application No. 62/931,589, filed on Nov. 6, 2019.

(51) Int. Cl.
*A61L 2/025* (2006.01)
*A61M 1/34* (2006.01)

(52) U.S. Cl.
CPC ........... *A61L 2/025* (2013.01); *A61M 1/3468* (2014.02); *A61M 1/3472* (2013.01); *A61M 1/3496* (2013.01); *A61M 1/3627* (2013.01)

(58) Field of Classification Search
USPC ...................................................... 604/6.08
See application file for complete search history.

(56) References Cited

U.S. PATENT DOCUMENTS

| | | | |
|---|---|---|---|
| 8,057,418 B2 * | 11/2011 | Korbling | A61M 1/3683 424/1.17 |
| 9,199,026 B2 * | 12/2015 | Greenberg | A61M 1/16 |
| 2003/0086817 A1 * | 5/2003 | Horton, III | A61M 1/3681 210/764 |
| 2004/0015119 A1 * | 1/2004 | Takashima | A61M 1/3681 607/106 |
| 2004/0039325 A1 | 2/2004 | Karp | |
| 2004/0256329 A1 * | 12/2004 | Meserol | A61M 1/3681 210/205 |
| 2006/0009821 A1 | 1/2006 | Perez | |
| 2009/0156976 A1 | 6/2009 | Korbling | |
| 2013/0131423 A1 | 5/2013 | Wang | |
| 2015/0121808 A1 | 5/2015 | Gaitas | |
| 2015/0122737 A1 | 5/2015 | Gaitas | |
| 2015/0122738 A1 | 5/2015 | Gaitas | |
| 2016/0058937 A1 | 3/2016 | Gaitas | |
| 2016/0334312 A1 | 11/2016 | Gaitas | |
| 2019/0168023 A1 | 6/2019 | Eltorai | |

FOREIGN PATENT DOCUMENTS

| | | | | |
|---|---|---|---|---|
| CN | 202605398 U | | 12/2012 | |
| WO | WO-2017062260 A2 * | | 4/2017 | .......... A61L 2/0052 |
| WO | WO-2019032943 A1 * | | 2/2019 | ............... A61L 2/10 |

OTHER PUBLICATIONS

Lubart, R. A Possible Mechanism for the Bactericidal Effect of Visible Light. Laser Therapy, vol. 20, No. 1, 2011, p. 17-22 [online], [retrieved on Dec. 31, 2024]. Retrieved from the Internet <URL: https://pmc.ncbi.nlm.nih.gov/articles/PMC3806074/>.*

McLaughlin et al., "Are There Naturally Occurring Pleomorphic Bacteria in the Blood of Healthy Humans?", Journal of Clinical Microbiology, pp. 4771-4775, Dec. 2002.

Scolaro et al., "Aggregation Behavior of Protoporphyrin IX in Aqueous Solutions: Clear Evidence of Vesicle Formation", J. Phys. Chem. B 2002, 106, pp. 2453-2459.

Dyson et al., "Animal models of sepsis: Why does preclinical efficacy fail to translate to the clinical setting?", Crit Care Med 2009, vol. 37, No. 1 (Suppl.), S30-S37.

"Wyss Institute awarded DARPA contract to further advance sepsis therapeutic device", Mar. 25, 2013, https://wyss.harvard.edu/news/wyss-institute-awarded-darpa-contract-to-further-advance-sepsis-therapeutic-device/.

Zhou et al., "Blood Purification and Mortality in Sepsis: A Meta-Analysis of Randomized Trials", Critical Care Medicine. 41(9), Sep. 2013, pp. 2209-2220.

International Search Report and Written Opinion of the International Searching Authority for PCT/US2020/070755, Mar. 29, 2021, 20 pages.

* cited by examiner

EXTRACORPOREAL BLOOD DISINFECTION SYSTEMS AND METHODS

CROSS REFERENCE TO RELATED APPLICATION

This application is a by-pass continuation of PCT International Application No. PCT/US2020/070755, filed on Nov. 6, 2020, and entitled Extracorporeal Blood Disinfection Systems and Methods, which claims priority benefit under 35 U.S.C. § 119(e) of U.S. Provisional Patent Application No. 62/931,589, filed on Nov. 6, 2020, and entitled Extracorporeal Blood Disinfection Systems and Methods, which are each hereby incorporated herein by reference in their entireties.

FIELD OF THE DISCLOSURE

The present disclosure generally relates systems and methods for extracorporeal disinfection of blood or blood products/derivatives, which may destroy, eradicate and/or reduce the number of harmful pathogenic microorganisms, or reduce of the rate of proliferation thereof, within the blood or blood products/derivatives. The present disclosure also relates to systems and methods for extracorporeal disinfection of harmful pathogenic microorganisms from mammalian blood or blood components involved in conditions such as sepsis, severe sepsis and/or septic shock.

BACKGROUND

Extracorporeal fluid treatment typically involves the removal of a body fluid from a patient, treatment of the external/removed fluid, and return of the treated fluid into the patient. Blood is one body fluid for which conventional extracorporeal techniques have been developed. Using such techniques, blood is typically treated to extract materials from the blood and/or add materials to augment the blood prior to return of the treated blood to the patient. In some techniques, blood is removed from the patient in a continuous flow and introduced into a chamber containing a filtration unit where the blood flows past a semi-permeable membrane. The semi-permeable membrane allows only select material in the blood to pass through the membrane for removal from the blood (or removal of the material that does not pass therethrough) and/or allows material to pass through the semi-permeable membrane and into the blood. After passage of material to and/or from the blood, the treated blood is discharged from the filtration unit for return to the patient. If material has been removed from the blood, is the removed material is separately discharged from the filtration unit.

One ailment that includes pathogens within a mammal's blood that is not satisfactorily treated by conventional extracorporeal techniques is sepsis. Acute sepsis is a metastatic infection that arises when infectious microbes in the circulatory system overwhelm the immune system and the pathogenic microorganisms can no longer be removed from circulating blood (by the body) faster than they are proliferating. Sepsis thus originates as an isolated infection of pathogenic microorganisms that become mobile in the circulatory system. When bacteria or viruses are present in the bloodstream, the condition is known as bacteremia or viremia. Pathogenic fungi can also be present in the bloodstream. Sepsis is a constellation of symptoms secondary to the infection that manifest as disruptions in heart rate, respiratory rate and/or body temperature. Bacteremia is rarely associated with any signs or symptoms, and most pathogenic microorganisms are readily removed from circulation by the humoral immune system.

When pathogenic organisms (e.g., non-mammalian single cell destructive organisms) begin to reproduce in the circulatory system and a mammalian body is unable to remove them at an adequate rate (if necessary), septicemia develops, and a systemic inflammatory response is initiated. This syndrome, SIRS, is one of the primary disease patterns in sepsis. If acute sepsis worsens to the point of end-organ dysfunction (such as renal failure, liver dysfunction, altered mental status or heart damage), the condition is referred to as "severe sepsis." Once severe sepsis worsens to the point where blood pressure can no longer be maintained by the body with intravenous fluid intervention alone, then the criteria for "septic shock" are met. Precipitating infections which may lead to septic shock, if severe enough, include appendicitis, pneumonia, bacteremia, diverticulitis, pyelonephritis, meningitis, pancreatitis and necrotizing fasciitis, for example.

It has been reported that acute sepsis kills approximately 120,000-200,000 people annually in the United States. Statistics have shown that sepsis is the second leading cause of death in non-coronary ICU patients. Overall, sepsis is the tenth most common cause of death in the United States and accounts for as much as 25% of ICU bed utilization, according to some reports. In fact, it has been said that the medical specialty practice of Critical Care Management was specifically developed as a result of septic mortality rates. According to some reports, overall sepsis mortality is in the range of 40-44%, with mortality rates rising to between 70-90% when sepsis proceeds to severe septicemia or septic shock (i.e., proceeds to organ dysfunction, hypotension or hypo-perfusion, or to hypotension despite adequate fluid resuscitation, respectively).

Septic shock, the most severe manifestation of sepsis, is a clinical syndrome that results, at least in part, from an activated systemic host inflammatory response to infection leading to cardiovascular collapse. Septic shock has become increasingly common in the North American population, potentially because of an increasing population of at risk elderly individuals (many of whom have chronic debilitating disease) and individuals with impaired immunity due to diseases (such as cancer and AIDS). According to some reports, about 750,000 cases of sepsis occur each year in the United States.

Common origins of infections that develop into sepsis include urinary tract infections, pneumonia, cellulitis, wounds and abscesses, sinusitis, meningitis, and surgical procedures to an infected area or the abdomen. The most common causative organisms associated with sepsis can include Gram-positive bacteria (e.g., *Staphylococcus aureus*, coagulase-negative *Staphylococcus, Streptococcus pyogenes, Streptococcus pneumoniae*, and *enterococci*), Gram-negative bacteria (e.g., *Proteus, Serratia, Pseudomonas aeruginosa, Neisseria meningitudis*, and *Escherichia coli Klebsiella pneumoniae*), anaerobic organisms and fungi (e.g., *Candida albicans*).

The progression from sepsis to septic shock follows the significant increase in serum levels of TNF-a, IFN-a, IL-1B, IL-8, and IL-6. Shock is a condition defined by inadequate tissue perfusion, such as resulting from vasodilation due to increased cytokine levels and intravascular fluid shifting. Increase in TNF-a levels is believed to be responsible for the onset of disseminated intravascular coagulation (DIC). These conditions, together with renal and liver failure, can cause cardiac collapse and respiratory failure (ARDS).

The signs and symptoms of sepsis vary according to the associated underlying disease/infection process(es). However, most symptomology is universal. Sepsis is typically preceded by a period of altered mental status (e.g., for approximately 24 hours) before other signs develop. Fatigue, malaise, myalgia, nausea, and vomiting are common early signs. Fever typically initially develops, but often declines to hypothermia in late stages. Elevated heart rate and respiratory rate typically develop as blood pressure becomes erratic. Blood pressure often eventually declines dramatically as plasma shifts and vasodilation worsens. Impaired renal function is typically evident with decreased urinary output, as is liver failure with jaundice.

Overall risk factors for sepsis include neonates, elderly, immune-compromised patients, such as AIDS or cancer patients, and splenectomized patients. Gram-positive bacterial sepsis is associated with intravenous catheters, indwelling mechanical devices, burns and IV drug usage. Risk factors for Gram-negative bacterial sepsis include iatrogenic immune-suppression, such as steroids and chemotherapy, gastrointestinal/genitourinary infections, cirrhosis, cancer, alcoholism, lymphatic disease, diabetes and parenteral nutrition (G-tubes). Fungal sepsis is typically associated with immune-suppression from long-term, broad-spectrum antibiotics, and protozoans have rarely been associated with sepsis.

No truly effective, curative treatments currently exist for sepsis, severe septicemia and septic shock. Some supportive measures, such as antibiotics, vasopressor agents and various endogenous strategies associated with attempts at blood "purification," are associated with some degree of lower mortality in patients with sepsis (primarily with treatments utilizing polymyxin B). For example, antibiotics are often inadequate to combat the overwhelming invasion of bacteria or other infectious microorganisms associated with the more severe manifestations of sepsis. Vasopressor agents may support hypotension associated with cardiovascular collapse, but fail to treat the infectious microorganisms. Current attempts at blood purification, which include hemoperfusion, plasma exchange, and hemofiltration with hemoperfusion, inadequately remove the infectious microorganisms associated with for sepsis, severe septicemia and septic shock.

As such, despite all current treatment approaches, mortality from all manifestations and degrees of severity of sepsis remains unacceptably high, and new and more effective treatments for sepsis are needed.

While certain aspects of conventional technologies have been discussed to facilitate disclosure of Applicant's inventions, the Applicant in no way disclaims these technical aspects, and it is contemplated that their inventions may encompass one or more conventional technical aspects.

In this specification, where a document, act or item of knowledge is referred to or discussed, this reference or discussion is not an admission that the document, act or item of knowledge or any combination thereof was, at the priority date, publicly available, known to the public, part of common general knowledge, or otherwise constitutes prior art under the applicable statutory provisions; or is known to be relevant to an attempt to solve any problem with which this specification is concerned.

SUMMARY

Briefly, the present disclosure satisfies the need for systems and method for disinfecting blood. In various embodiments, the inventive systems and methods are particularly advantageous for treatment and/or prevention of sepsis.

The present inventions may address one or more of the problems and deficiencies of the art discussed above. However, it is contemplated that the inventions may prove useful in addressing other problems and deficiencies in a number of technical areas. Therefore, the claimed inventions should not necessarily be construed as limited to addressing any of the particular problems or deficiencies discussed herein.

In some embodiments, the disinfection systems and methods of the present disclosure comprise an extracorporeal device designed to address pathogenic microbial infection associated with sepsis (including severe sepsis and septic shock) by externally reducing or eliminating the presence of the infectious microorganisms associated with the condition (s) in a mammal's blood. The systems and methods also provide an effective and unique stand-alone or adjunctive therapeutic intervention to standard measures used in the treatment of sepsis (including severe sepsis and septic shock), such as compared to anti-infective drug therapy, to combat the overwhelming infectious process characteristic of the condition wherein infecting microbial organisms can no longer be removed from circulating blood faster than they are proliferating.

In some embodiments, the disinfection systems and methods of the present disclosure comprise a blood pump with a built in or attached microbicidal lighting device intended to expose a blood flow of mammalian blood at sufficient intensity and duration that is effective in reducing or eliminating or slowing the proliferation of a broad range of infectious sources, such as infectious sources known to be associated with sepsis (e.g., severe sepsis and/or septic shock). In some embodiments, the device may separate selected components of blood before light treatment is applied. In some embodiments, the device may include an attached or incorporated filter designed to remove one or more unwanted by-product of disinfection or one or more toxins released by an infectious microorganisms from the blood before returning the blood to the patient's body, and/or an attached or incorporated infusion component to that restores or supplements one or more component into the blood that is/may be affected by the microbicidal process and/or by the infectious agents/microorganisms.

In some embodiments, the device may include an optical diffuser associated with the lighting device configured to scatter light from the irradiation source resulting in uniform intensity of the light incident on the blood. In some embodiments, the device may include a reflector configured to reflect stray light back into a treatment pathway of the blood and/or to improve uniformity of irradiation. In some embodiments, the device may include a heatsink device associated with the lighting device configured to dissipate heat from the lighting device to maintain the temperature of the lighting device below a predefined temperature such that the lighting device is prevented from heating the treated blood above a predefined temperature. In some embodiments, the device may include an ultrasonic transducer configured to ultrasonically agitate or vibrate the blood within the treatment pathway at a frequency within the range of about 20 kHz and about 500 kHz. In some such embodiments, the treatment pathway may be formed of a flexible material, and the pathway itself may be ultrasonically agitated by the ultrasonic transducer. The ultrasonic agitation of the blood may act to decrease blood clot formation within the treatment pathway and/or aid in the destruction or elimination of microorganisms within the blood.

In some embodiments, the disinfection systems and methods of the present disclosure may function similar to a dialysis loop procedure where blood is removed from the patient via tubing which has been placed in a patient's blood vessel (e.g., vein). The tubing may be coupled to an external blood pumping device, and a microbicidal light emitting device or source that emits lights within porphyrin absorption peak B/Soret band and Q bands. In some embodiments, the systems and methods may separate the patient's blood into component parts, such as plasma, white blood cells (WBCs) and red blood cells (RBCs), and expose one or more selected portions of the blood composition to the light source. Whole blood or separated portions of blood passing through/by the light source are effectively disinfected by the light's microbicidal action by one or more of the following effects: elimination of pathogenic microorganisms, reduction in the number of pathogenic microorganisms, and reducing the rate of proliferation of pathogenic microorganisms. In some embodiments, the disinfection systems and methods of the present disclosure may include a filter or infusion component. In one embodiment, the filter may be built into or attached to the tubing returning blood to the patient in the portion of the tubing distal to the point where the light disinfection has been applied, for example.

In some embodiments, the disinfection systems and methods of the present disclosure include at least one microbicidal lighting device or lighting mechanism that emits light in the porphyrin absorption peak B/Soret and Q bands—i.e., the 380-425 nm wavelength (violet) range and four peaks within the 500 to 700 nm range. The Applicant submits that these light spectrums can disinfect and/or sterilize mammalian blood to treat infections that typically cause or result in sepsis (i.e., kill pathogenic microorganisms and/or prevent such microorganisms from reproducing that cause, or tend to cause, sepsis). It is believed that these light spectrums are otherwise substantially safe to mammalian blood. For example, the Applicant submits that these light spectrums are absorbed by single cell organisms (e.g., non-mammalian cells) (specifically, by the forms of porphyrin found within organisms thereof, for example) and cause the population of a triplet state, resulting in the creation of a singlet oxygen molecule, radical species, superoxide anions, free hydroxyl radicals, and/or hydrogen peroxide which can serve to inactivate the organism by reacting with susceptible cellular biomolecules such as lipids, amino acids, and nucleic acid heterocyclic bases, for example. The forms of porphyrin found within mammalian cells are generally structurally distinct from those forms found in single cell organisms (for example, include heme, a metalloporphyrin, which uniquely contains an iron ion) and do not generally result in deactivating said mammalian cells when exposed to the light bands noted above. Additionally, the structural differences and unique cellular repair mechanisms in mammalian cells (as compared to single cell organisms for example) results in minimal damage to mammalian cells incidentally exposed to disinfecting wavelengths, whereas single cell organisms receiving a similar dose can be significantly deactivated. As used within this disclosure, the term porphyrin (and its linguistic variants) specifically refers to the porphyrin molecules found within single cell organisms, and especially those porphyrin molecules that can be induced to effect cellular deactivation through activation with certain wavelengths of light as described herein.

In some embodiments, the disinfection systems and methods of the present disclosure may include a blood pump with a built in or attached microbicidal lighting device intended to expose blood flow at sufficient intensity and duration (i.e., total dose) that is effective in reducing or eliminating or slowing the proliferation of a broad range of infectious sources, such as those associated with sepsis (including severe sepsis and/or septic shock).

In one embodiment, the device may separate selected components of blood before light treatment is applied, and/or the systems and methods may include an attached or built in filter designed to remove any potential toxins released by the microorganisms and/or unwanted by-products of disinfection before returning the patient's blood to their body, and/or an attached or incorporated infusion component configured to restore or supplement one or more blood component of the treated blood that is negatively affected by the treatment proves (e.g., negatively affected by the microbicidal light).

In some embodiments, the dose of light emitted from the at least one microbicidal lighting device of the systems and methods may be configured to destroy, eradicate and/or reduce the number of harmful pathogenic microorganisms, or reduce of the rate of proliferation thereof, within the blood or blood portion/derivative that are associated with sepsis (including sever sepsis and septic shock). For example, in some embodiments, the dose of light emitted from the at least one microbicidal lighting device may be configured to destroy, eradicate and/or reduce the number of at least the pathogenic microorganisms listed below in Table 1, or reduce of the rate of proliferation thereof, within the treated blood.

TABLE 1

| Gram-Positive Bacteria | Gram-Negative Bacteria | Bacterial Endospores | Yeast & Filamentous Fungi |
|---|---|---|---|
| Staphylococcus aureus (incl. MRSA) | Acinetobacter baumannii | Bacillus cereus | Aspergillus niger |
| Clostridium perfringens | Pseudomonas aeruginosa | Clostridium difficile | Candida albicans |
| Clostridium difficile | Klebsiella pneumoniae | | Saccharomyces cerevisiae |
| Enterococcus faecalis | Proteus vulgaris | | |
| Staphylococcus epidermidis (CONS) | Escherichia coli | | |
| Staphylococcus hyicus (CONS) | Salmonella enteritidis | | |
| Staphylococcus pyogenes | Shigella sonnei | | |
| Listeria monocytogenes | Serratia spp | | |
| Bacillus cereus | | | |
| Mycobacterium terrae | | | |

In a first aspect, this disclosure provides an extracorporeal blood disinfection system comprising an input tube, a disinfection unit and an output tube. The input tube forms a flowpath for the flow of infected blood from a mammalian patient. The disinfection unit comprises a microbicidal light emitting device configured to emit visible light within the range of about 380 nm to about 425 nm and/or about 500 nm to about 700 nm, and a treatment flowpath in communication with the input tube that is substantially transparent to the emitted light of the microbicidal light emitting device for receiving at least a portion of the flow of the infected blood therethrough. The microbicidal light emitting device effectuates a dose of the emitted light to the infected blood flowing through the treatment flowpath to disinfect the blood. The output tube is in fluid communication with the treatment flowpath forming a flowpath for the flow of the disinfected blood from the disinfection unit back to the patient.

In some embodiments, the dose of light is effective in at least one of: eliminating pathogenic microorganisms from the infected blood; partially reducing the number of the pathogenic microorganisms in the infected blood; and reducing the rate of proliferation of the pathogenic microorganisms in the infected blood. In some such embodiments, the pathogenic microorganisms comprise microorganisms associated with at least one of sepsis, severe sepsis and septic shock. In some such embodiments, the pathogenic microorganisms comprise at least one of bacteria, fungi, yeast and a combination thereof. In some such embodiments, the pathogenic microorganisms comprise at least one of gram positive bacteria, gram negative bacteria, bacterial endospores, yeast, filamentous fungi and a combination thereof. In some such embodiments, the pathogenic microorganisms comprise at least one of *Staphylococcus aureus, Clostridium perfringens, Clostridium difficile, Enterococcus faecalis, Staphylococcus epidermidis, Staphyloccocus hyicus, Streptococcus pyogenes, Listeria monocytogenes, Bacillus cereus, Mycobacterium terrae, Acinetobacter baumannii, Pseudomonas aeruginosa, Klebsiella pneumoniae, Proteus vulgaris, Escherichia coli, Salmonella enteritidis, Shigella sonnei, serratia* spp, *Bacillus cereus, Clostridium difficile, Aspergillus niger, Candida albicans, Saccharomyces cerevisiae* and a combination thereof.

In some embodiments, the system further comprises an ultrasonic transducer configured to agitate at least the infected blood flowing through the treatment flowpath within the range of about 20 kHz to about 500 kHz. In some embodiments, the system further comprises a pump configured to at least one of: provide the flow of infected blood from the patient through the input tube; pass the blood from the input tube through the treatment flowpath; and provide the flow of disinfected blood to the patient through the output tube.

In some embodiments, the system further comprises at least one filter configured to filter out at least one substance from the infected blood and/or the disinfected blood. In some such embodiments, the at least one filter is configured to filter out at least one constituent part or substance of the disinfected blood that has become degraded due to the dose of the emitted light.

In some embodiments, the system further comprises a separator that separates at least one constituent part of the infected blood upstream of the treatment flowpath. In some such embodiments, the separator separates at least one of plasma, white blood cells red blood cells from the infected blood. In some other such embodiments, the treatment flowpath receives a flow of the at least one separated constituent part of the infected blood. In some other such embodiments, the system further comprises a manifold that combines the separated constituent parts of the blood prior to flowing back to the patient.

In some embodiments, the system further comprises at least one infusion component that introduces at least one substance into the disinfected blood. In some such embodiments, the dose of emitted light degrades at least one constituent part or substance of the infected blood, and the at least one substance introduced into the disinfected blood comprises the at least one constituent part or component of the infected blood in a non-degraded state and/or treats the degraded at least one constituent part or substance of the infected blood.

In some embodiments, the system further comprises at least one heparin pump configured to introduce heparin into the infected blood and/or the disinfected blood. In some embodiments, the system further comprises at least one air removal mechanism configured to remove air from the infected blood and/or the disinfected blood prior to flowing back to the patient. In some embodiments, the mammalian patient is a human patient.

In some embodiments, the emitted light comprises light within the range of about 380 nm to about 420 nm. In some embodiments, the emitted light comprises light within the range of about 400 nm to about 415 nm. In some embodiments, the emitted light comprises light of about 405 nm. In some embodiments, the emitted light comprises light within the range about 500 nm to about 700 nm.

In some embodiments, the emitted light comprises light within the range of at least one of about 500 nm to about 520 nm, about 530 nm to about 555 nm, about 565 nm to about 590 nm and about 615 nm to about 645 nm. In some embodiments, the emitted light comprises light within the range of about 500 nm to about 520 nm. In some embodiments, the emitted light comprises light within the range of about 530 nm to about 555 nm. In some embodiments, the emitted light comprises light within the range of about 565 nm to about 590 nm. In some embodiments, the emitted light comprises light within the range of about 615 nm to about 645 nm.

As noted above, the Applicant submits that these light spectrums are selectively absorbed by single cell organisms (e.g., non-mammalian cells) (such as by the porphyrin thereof, for example), and not absorbed by mammalian multi-cell organisms (as they are void, or at least substantially void, of porphyrin, for example).

In some embodiments, the treatment flowpath comprises a translucent coil extending about the microbicidal light emitting device. In some embodiments, the disinfection unit further comprises an optical diffuser associated with the microbicidal light emitting device configured to scatter the emitted light such that the emitted light incident on the infected blood within the treatment flowpath is of a substantially uniform intensity. In some embodiments, the disinfection unit further comprises a reflector configured to reflect emitted light such that it is incident to the infected blood.

In some embodiments, the disinfection unit further comprises a heatsink device associated with the microbicidal light emitting device configured to dissipate heat from the microbicidal light emitting device to maintain the temperature of at least a portion thereof below a predefined temperature such that the microbicidal light emitting device is prevented from heating the blood within the treatment pathway above a predefined temperature.

In some embodiments, the treatment flowpath comprises a folded channel. In some embodiments, the treatment flowpath comprises a channel extending along a plane. In some embodiments, the treatment flowpath comprises a coiled channel. In some such embodiments, the coiled channel comprises a helical channel. In some such embodiments, the disinfection unit comprises an emitter shaft, and wherein the coiled channel extends about the emitter shaft.

In some such embodiments, the microbicidal light emitting device comprises a plurality of light emitting diodes (LEDs) provided the emitter shaft, and wherein the emitter shaft includes a thermal management device configured to cool the LEDs. In some other such embodiments, the emitter shaft comprises a light pipe configured to direct the emitted light to the treatment pathway, and wherein the microbicidal light emitting device comprises at least one light emitting device positioned at an end of the emitter shaft that emits light into and/or through the emitter shaft. In some such embodiments, the at least one light emitting device emits light along a longitudinal axis of the emitter shaft, and wherein the emitter shaft redirects the light emitted from the at least one light emitting device in an outward direction extending away from the longitudinal axis. In some such embodiments, the coiled channel does not extend about the at least one light emitting device.

In some embodiments, the microbicidal light emitting device comprises a plurality of LEDs. In some such embodiments, the LEDs are provided on at least one printed circuit board. In some such embodiments, the disinfection unit further comprises at least one thermal management device (e.g., a heatsink device) coupled to or otherwise associated with the at least one printed circuit board configured to dissipate heat from the LEDs.

In another aspect, this disclosure provides a method for extracorporeally disinfecting blood of a mammalian patient. The method comprises utilizing an extracorporeal blood disinfection system as described above comprising an input tube, a disinfection unit and an output tube. Utilizing the extracorporeal blood disinfection system comprises drawing a flow of infected blood from the mammalian patient via the input tube. Utilizing the extracorporeal blood disinfection system further comprises passing at least a portion of the infected blood through the disinfection unit. Utilizing the extracorporeal blood disinfection system also comprises reintroducing the disinfected blood from the disinfection unit back into the patient via the output tube.

Certain embodiments of the presently-disclosed extracorporeal blood disinfection systems and methods may include several features, no single one of which is solely responsible for their desirable attributes. Without limiting the scope of the extracorporeal blood disinfection systems and methods, their more prominent features will now be discussed briefly. After considering this discussion, and particularly after reading the section of this specification entitled "Detailed Description," one will understand how the features of the various embodiments disclosed herein provide a number of advantages over the current state of the art.

These and other features and advantages of this disclosure will become apparent from the following detailed description of the various aspects of the disclosure taken in conjunction with the appended claims and the accompanying drawings.

BRIEF DESCRIPTION OF THE DRAWINGS

The present disclosure will hereinafter be described in conjunction with the following drawing figures, which are not necessarily drawn to scale for ease of understanding, wherein the same reference numerals retain their designation and meaning for the same or like elements throughout the various drawings, and wherein.

DETAILED DESCRIPTION

Aspects of the present disclosure and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the details of the inventions. It should be understood, however, that the detailed description and the specific example(s), while indicating embodiments of inventions of the present disclosure, are given by way of illustration only, and are not by way of limitation. Various substitutions, modifications, additions and/or arrangements within the spirit and/or scope of the underlying inventive concepts will be apparent to those skilled in the art from this disclosure.

Approximating language, as used herein throughout disclosure, may be applied to modify any quantitative representation that could permissibly vary without resulting in a change in the basic function to which it is related. Accordingly, a value modified by a term or terms, such as "about" or "substantially," is not limited to the precise value specified. For example, these terms can refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%. In some instances, the approximating language may correspond to the precision of an instrument for measuring the value.

Figure 1:
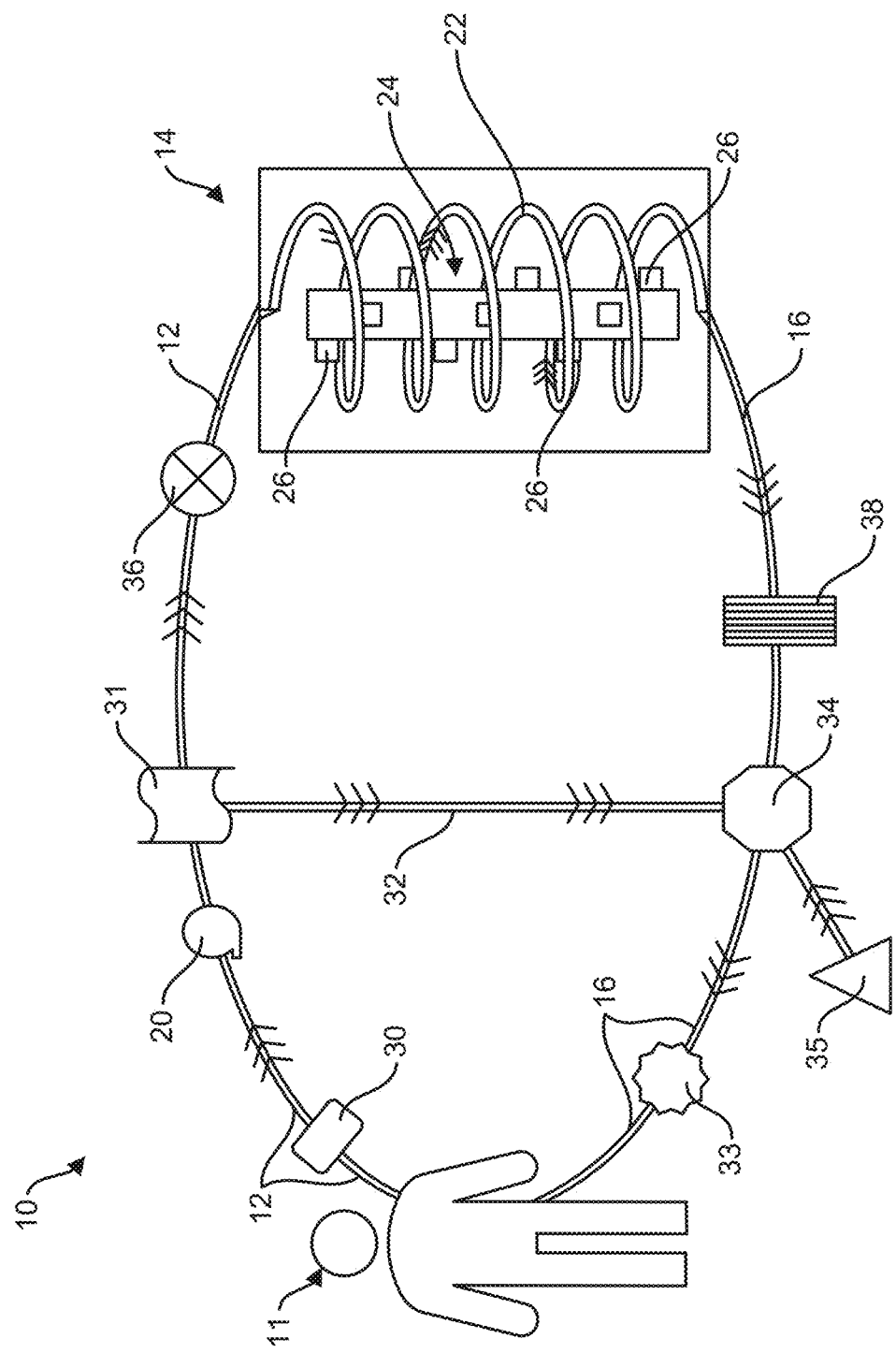
FIG. 1 is a diagram illustrating an exemplary extracorporeal blood disinfection system of the present disclosure.
Figure 2:
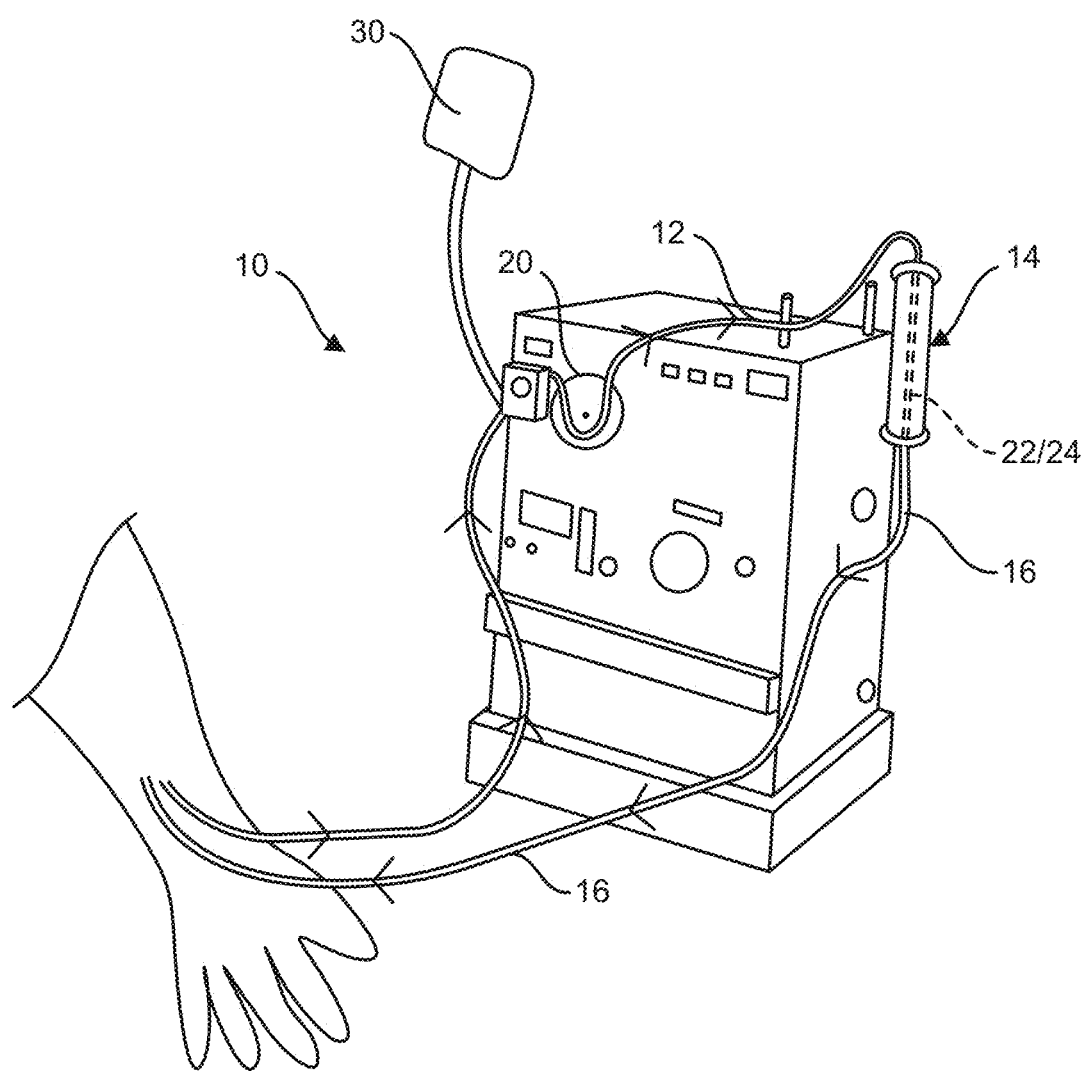
FIG. 2 is a perspective view of the extracorporeal blood disinfection system of FIG. 1.

As shown in FIGS. 1 and 2, in some exemplary embodiments a disinfection system and related method 10 of the present disclosure may include an extracorporeal disinfection device 14 comprising a microbicidal light emitting device 24 configured to emit visible light within the range of about 380 nm to about 425 nm and/or about 500 nm to about 700 nm (e.g., which may be selectively absorbed by single cell organisms (e.g., non-mammalian cells) and not by mammalian multi-cell organisms), and a treatment flowpath 22 that is substantially transparent to the emitted light of the microbicidal light emitting device 24 for receiving at least a portion of a flow of infected blood from a patient 11. These light spectrums can be selectively absorbed by single cell organisms (e.g., non-mammalian cells) (such as by the porphyrin thereof, for example), and may not be absorbed by mammalian multi-cell organisms (as they are void, or at least substantially void, of porphyrin, for example). The extracorporeal disinfection device 14 may expose a blood flow to such light wavelengths at sufficient intensity and duration that the light is effective in reducing or eliminating or slowing the proliferation of a broad range of infectious sources, such as infectious sources known to be associated with sepsis (e.g., severe sepsis) and/or septic shock, such as those of Table 1.

The patient 11 may be a mammalian patient. For example, the patient 11 may be a human. As another example, the patient 11 may be a non-human mammal, such as non-human mammalian animal.

The system 10 and/or the extracorporeal disinfection device 14 itself is configured such that the microbicidal light emitting device 24 externally (with respect to the patient 11) effectuates a dose of the emitted light to the infected blood flowing through the treatment flowpath 22 that reduces or eliminates the presence of infectious microorganisms in the blood that are commonly associated with sepsis, severe sepsis and/or septic shock to address a pathogenic microbial infection of the patient 11 that is leading to, or could/would lead to, sepsis, severe sepsis and/or septic. The system 10 and treatment method associated therewith may thereby provide a stand-alone or adjunctive therapeutic intervention to standard measures used in the treatment of sepsis, severe sepsis and/or septic shock to combat the overwhelming infectious process characteristic of the conditions where infecting microbial organisms can no longer be removed from circulating blood by the body's natural processes faster than they are proliferating. For example, the system 10 and treatment method associated therewith may be utilized in conjunction with an anti-infective drug therapy.

In some embodiments, the microbicidal lighting device 24 of the extracorporeal disinfection device 14 of the disinfection system 10 is configured to emit light in the 380-420 nm (violet) range. In some such embodiments, the light spectrum emitted from the microbicidal lighting device 24 may thereby be configured as bactericidal, but yet safe for processing the blood of a patient 11 without critically damaging the blood when infecting microbial organisms can no longer be removed from circulating blood by the patient 11 faster than they are proliferating. As noted above, the light emitted from the microbicidal lighting device 24 is of wavelengths that may be selectively absorbed by single cell organisms (e.g., non-mammalian cells) (such as by the porphyrin thereof, for example), and may not be absorbed by mammalian multi-cell organisms (as they are void, or at least substantially void, of porphyrin, for example).

In some embodiments, system 10 is configured to effectuate a dose of the light emitted from the microbicidal light emitting device 24 to the infected blood of the patient 11 flowing through the treatment flowpath 22 that destroys, eradicates and/or reduces the number of harmful pathogenic microorganisms, or reduces the rate of proliferation thereof, within the blood or blood products/derivatives, such as those that cause sepsis (e.g., tend to cause, known to cause or may cause sepsis). For example, in some embodiments, the system 10 is configured to effectuate a dose of the light emitted from the microbicidal light emitting device 24 to the infected blood of the patient 11 flowing through the treatment flowpath 22 that destroys, eradicates and/or reduces, or reduces the rate of the proliferation of, infectious microorganisms in the blood that (can or likely) cause UTI, pneumonia, cellulitis, wounds and abscesses, sinusitis and/or meningitis. In some embodiments, the system 10 is configured to effectuate a dose of the light emitted from the microbicidal light emitting device 24 to the infected blood of the patient 11 flowing through the treatment flowpath 22 that destroys, eradicates and/or reduces, or reduces the rate of the proliferation of, gram-positive bacteria (e.g., *Staphylococcus aureus, coagulase*-negative *Staphylococcus, Streptococcus pyogenes, Streptococcus pneumoniae*, and *enterococci*), gram-negative bacteria (e.g., *Proteus, Serratia, Pseudomonas aeruginosa, Neisseria meningitudis, Escherichia coli Klebsiella pneumoniae*), anaerobic organisms, fungi (e.g., *Candida albicans*) and/or combinations thereof.

The system 10 may thereby be configured to effectuate a dose of the light emitted from the microbicidal light emitting device 24 to the infected blood of the patient 11 flowing through the treatment flowpath 22 effective in at least one of: selectively eliminating pathogenic microorganisms from the infected blood; selectively partially reducing the number of the pathogenic microorganisms in the infected blood; and selectively reducing the rate of proliferation of the pathogenic microorganisms in the infected blood. The pathogenic microorganisms may comprise microorganisms associated with at least one of sepsis, severe sepsis and septic shock to treat and/or prevent at least one of sepsis, severe sepsis and septic shock. For example, in some embodiments, the pathogenic microorganisms may comprise at least one of bacteria, fungi, yeast and a combination thereof. In some such embodiments, the pathogenic microorganisms may comprise at least one of gram positive bacteria, gram negative bacteria, bacterial endospores, yeast, filamentous fungi and a combination thereof. In some such embodiments, the pathogenic microorganisms may comprise at least one of *Staphylococcus aureus, Clostridium perfringens, Clostridium difficile, Enterococcus faecalis, Staphylococcus epidermidis, Staphyloccocus hyicus, Streptococcus pyogenes, Listeria monocytogenes, Bacillus cereus, Mycobacterium terrae, Acinetobacter baumannii, Pseudomonas aeruginosa, Klebsiella pneumoniae, Proteus vulgaris, Escherichia coli, Salmonella enteritidis, Shigella sonnei, serratia* spp, *Bacillus cereus, Clostridium difficile, Aspergillus niger, Candida albicans, Saccharomyces cerevisiae* and a combination thereof.

In some embodiments, the microbicidal light emitting device 24 of the extracorporeal disinfection device 14 is configured to emit light within the range of about 380 nm to about 420 nm. In some embodiments, the microbicidal light emitting device 24 of the extracorporeal disinfection device 14 is configured to emit light within the range of about 400 nm to about 415 nm. In some such embodiments, the microbicidal light emitting device 24 of the extracorporeal disinfection device 14 is configured to emit light of about 405 nm. In some embodiments, the microbicidal light emitting device 24 of the extracorporeal disinfection device 14 is configured to emit light within the range about 500 nm to about 700 nm.

In some embodiments, the microbicidal light emitting device 24 of the extracorporeal disinfection device 14 is configured to emit light within the range of at least one of about 500 nm to about 520 nm, about 530 nm to about 555 nm, about 565 nm to about 590 nm and about 615 nm to about 645 nm. In some such embodiments, the microbicidal light emitting device 24 of the extracorporeal disinfection device 14 is configured to emit light within the range of about 500 nm to about 520 nm, within the range of about 530 nm to about 555 nm, within the range of about 565 nm to about 590 nm and/or within the range of about 615 nm to about 645 nm.

The light emitted from the microbicidal lighting device 24 may thereby be of one or more wavelengths that may be selectively absorbed by single cell organisms (e.g., non-mammalian cells) (such as by the porphyrin thereof, for example), as opposed to being absorbed by mammalian multi-cell organisms (as they are void, or at least substantially void, of porphyrin, for example).

As shown in FIGS. 1 and 2, the disinfection system 10 and related treatment methods may function similar to a dialysis loop procedure where blood is removed from the patient 11 via an input passageway, tube or flow 12 which has been placed in, or otherwise fluidly coupled to, a blood vessel (e.g., a vein or artery) of the patient 11. The input tube 12 may be threaded through/to an extracorporeal blood pumping device 20 and extend in relatively close physical proximity to the extracorporeal disinfection device 14 such that at least some of the emitted light thereof is incident on the blood.

The input tube 12 and the output tube 16 may each comprise any tube, hose or other mechanism that forms at least one sterile hollow flow channel for the passage of the flow of blood from the patient 11 therethrough. The input tube 12 and the output tube 16 may each comprise any biologically- or blood-compatible extracorporeal tube or like member. In some embodiments, the input tube 12 and the output tube 16 may be formed of a biologically- or blood-compatible material, such as PVC, polyurethane, ethylene vinyl acetate (EVA), polyacrylonitrile (pAN), silicone, a thermoplastic elastomer (TPE) or a combination thereof, for example.

In some embodiments, the input tube 12 and/or the output tube 16 may include at least a portion that is transparent or translucent such that the flow of blood therethrough is visible to the naked eye. In some embodiments, the input tube 12 and/or the output tube 16 may be flexible to form a flexible flowpath extending between and connecting the patient 11 and the system 10. In one embodiment, the input tube 12 and the output tube 16 are thin, flexible, plastic hoses.

In some embodiments, the input tube 12 is a continuous integral tube, and the output tube 16 is a continuous integral tube that is separate and distinct from the input tube 12 but in fluid communication with the input tube 12. In some other embodiments, the input tube 12 and the output tube 16 are portions of a single continuous integral tube. In some other embodiments, at least one of the input tube 12 and the output tube 16 are formed of a plurality of interconnected tubes (in fluid communication).

The input tube 12 and/or the output tube 16 may be fluidically coupled to a blood vessel (e.g., vein or artery) of the patient for the flow of blood therefrom or thereto, respectively. The input tube 12 and the output tube 16 may be fluidly coupled to the same blood vessel of the patient 11 (e.g., different portions thereof), or fluidly coupled to different blood vessels of the patient 11. In some embodiments, the input tube 12 and/or the output tube 16 may be fluidly coupled to a blood vessels of the patient 11 via a needle or catheter, for example.

The input tube 12 and the output tube 16 may form an internal passageway that allows for the flow of the blood therethrough. For example, the cross-sectional size and shape of the internal passageways formed by the input tube 12 and the output tube 16 may be configured to allow the blood to flow therethrough without clogging or clotting of the blood (which may be related, at least in part, to the pressure and/or flow rate of the blood within the tube via the at least one pump 20). In some such embodiments, the input tube 12 and the output tube 16 may form an internal passageway with a minimum internal cross-sectional area of at least about 1.25 mm$^2$. As a further example, the surface finish and/or material of the internal passageway of the input tube 12 and the output tube 16 may be configured to allow the blood to flow therethrough without clogging or clotting of the blood (which may be related, at least in part, to the pressure and/or flow rate of the blood within the tube via the at least one pump 20). For example, the internal surfaces of the input tube 12 and the output tube 16 that form the internal passageways thereof may be substantially smooth (e.g., comprise a surface roughness of 0.5 um Ra or less) and/or include an low friction and/or hydrophobic substance (e.g. polytetrafluoroethylene, fluorinated ethylene propylene, manganese oxide polystyrene nano-composites, zinc oxide polystyrene nano-composites, fluorinated silanes and silica nano-coatings).

The extracorporeal blood pump 20 may be configured to draw a flow of blood from the patient 11 via the input tube 12 and to pass a flow of blood from the patient 11 through at least the extracorporeal disinfection device 14 (and any other potential component of the system 10, as described further below) and back into the patient 11 via an output passageway, tube or flow 16, at least in part. The extracorporeal blood pump 20 may comprise any biologically- or blood-compatible extracorporeal pump mechanism effective to form a flow of the infected blood from the patient 11 via the via the input tube 12, through at least the extracorporeal disinfection device 14, and back to (and into) the patient 11 via the output tube 16. For example, the extracorporeal blood pump 20 may comprise a centrifugal extracorporeal blood pump, a roller extracorporeal blood, a pulsatile tube compression extracorporeal pump, a ventricular extracorporeal pump or another pump type or pump configuration (such as another peristaltic pump configuration). However, it is noted that any blood pump may be utilized.

As shown in FIGS. 1 and 2, the blood pump 20 may be positioned between the patient 11 and the extracorporeal disinfection device 14 along the input tube 12 in the direction of the flow of the blood. In some such embodiments, the blood pump 20 can act on the input tube 12 to form, at least in part, the flow of the blood therethrough. In some alternative embodiments (not shown), the blood pump 20 may be positioned between the extracorporeal disinfection device 14 and the patient 11 along the output tube 16 in the direction of the flow of the blood. In some such embodiments, the blood pump 20 may act on the c to form, at least in part, the flow of the blood therethrough. In some other embodiments (not shown), the system 10 may include a plurality of blood pumps 20, which may be positioned before and/or after the extracorporeal disinfection device 14 in the direction of the flow of the blood.

In some embodiments, as shown in FIGS. 1 and 2, the system 10 and method may include a blood pump 20 with a built-in or attached extracorporeal disinfection device 14 with a microbicidal lighting device 24 intended to expose blood flow at sufficient intensity and duration that is effective in reducing or eliminating or slowing the proliferation of a broad range of infectious sources, such as those associated with sepsis, severe sepsis and/or septic shock.

In some embodiments, as shown in FIG. 1, the system 10 and method may include at least one input 30 positioned upstream of the extracorporeal disinfection device 14, such as proximate to the patient 11. The input 30 may introduce at least one substance into the flow of blood flowing through the input tube 12. In one embodiment, the input 30 may comprise a substance that aids or facilities the flow of the blood through the input tube 12, extracorporeal disinfection device 14 and/or the output 16. For example, the input 30 may comprise an anticoagulant pump or supply (e.g., a heparin pump or supply) that decreases the clotting ability of the blood to prevent clots from forming in the input tube 12, the extracorporeal disinfection device 14 and/or the output 16 that restrict the flow of the blood therethrough. As another example, the input 30 may comprise blood thinner pump or supply that increases the amount of time it takes the blood to clot and/or reduces the viscosity of the blood to prevent restriction of the flow of the blood. In some embodiments, the least one input 30 may be positioned downstream of the extracorporeal disinfection device 14, or comprise at least one first input 30 positioned upstream of the extracorporeal disinfection device 14 and at least one second input 30 positioned upstream of the extracorporeal disinfection device 14.

In some embodiments, as shown in FIG. 1, the system 10 and related method may include a separator 31 that separates the blood of the patient 11 into component parts, such as plasma, white blood cells (WBCs) and/or red blood cells (RBCs). One or more selected portions of the blood composition may thereby flow to the extracorporeal disinfection device 14 and be treated thereby, as shown in FIG. 1. Whole blood or separated portions of blood passing through/by the light source may thereby be effectively disinfected by the light's microbicidal action by one or more of the following effects: elimination of pathogenic microorganisms, reduction in the number of pathogenic microorganisms, and reducing the rate of proliferation of pathogenic microorganisms. As also shown in FIG. 1, one or more separated portion of the flow of blood isolated by the separator 31 may be directed by a diverter pathway 32 downstream of the extracorporeal disinfection device 14 and rejoined with the treated portion of the flow of blood in the output tube 16. In some embodiments, the separator 31 may comprise one or more semipermeable membranes, comprised of cellulose acetate, nitrocellulose, polysulfone, or other membrane material, and containing variable or fixed size pores or openings. In other embodiments, the separator may comprise one or more microfluidic channels. A vacuum pump, microfluidic pump, or other pump mechanism may be used to create a pressure gradient to draw material through the separator.

In some embodiments, as shown in FIG. 1, the system 10 and related method may include at least one pressure monitor 36. The pressure monitor 36 may be positioned upstream of the extracorporeal disinfection device 14 (and downstream or upstream of the at least one pump 20), as shown in FIG. 1, and/or downstream of the extracorporeal disinfection device 14. The pressure monitor 36 may be any pressure monitoring device configured to detect (and potentially display or otherwise indicate) the blood pressure of the patient 11, the pressure of the blood flowing through the input tube 12, the pressure of the blood flowing through the extracorporeal disinfection device 14 and/or the pressure of the blood flowing through the output tube 16. In some embodiments, the system 10 and related method may utilize blood information from the at least one pressure monitor 36 to determine the operation of the pump 20, the input 30 and/or the treatment or infusion material 35 to maintain the blood pressure within a particular range, for example.

As also shown in FIG. 1, in some embodiments the disinfection systems and methods include a filter 38 configured to remove or otherwise filter out at least one substance, component and/or or portion from the flow of blood. In one embodiment, the filter 38 may be built into or attached to the output tubing 16 returning the treated blood to the patient 11 downstream of the extracorporeal disinfection device 14, as shown in FIG. 1. In this way, the filter 38 may remove or otherwise filter out at least one substance from the treated blood, such as one or more portion of the blood that is altered, destroyed or otherwise effected by the light treatment of the extracorporeal disinfection device 14. For example, the filter 38 may be configured to filter out at least one constituent part or substance of the disinfected blood flowing through the output tube 16 that has become degraded due to the dose of the emitted light from the extracorporeal disinfection device 14.

In some embodiments, the filter 38 may positioned upstream of the extracorporeal disinfection device 14 to remove or otherwise filter out at least one substance from the untreated blood flowing through the input tube 12. In some embodiments, at least a first filter 38 may positioned upstream of the extracorporeal disinfection device 14 to remove or otherwise filter out at least one substance from the untreated blood flowing through the input tube 12, and at least a second filter 38 may positioned downstream of the extracorporeal disinfection device 14 to remove or otherwise filter out at least one substance from the treated blood flowing through the output tube 16.

In some embodiments, the filter 28 may comprise a filter medium that defines a plurality of passageways therethrough of a particular size or ranges of sizes. The filter may thereby be configured to prevent components or portions of the flow of blood from flowing therethrough that are larger than the size(s) of the passageways to filter out the components or portions from the blood. As another example, the filter 28 may comprise a substance that binds, bonds or otherwise couples to one or more components or portions of the flow of blood flowing therethrough or thereover. The filter may thereby be configured to prevent components or portions of the flow of blood from flowing therethrough or thereover that bind to the substance to filter out the components or portions from the blood. In some embodiments, the filter 28 may comprise aluminosilicates, molecular sieves, activated charcoal, silicalite, zeolite, composite materials comprising a selective molecular absorber (such as above) and a binder agent, such as a polymer, zeolite-polymer composites, nanofiber mesh, semipermeable membrane (e.g., that is selective to molecules based on size), synthetic ion channel membranes (e.g., that is selective to molecules based on size and/or polarity/solubility) or a combination thereof as filter media.

As shown in FIG. 1, the system 10 may include a manifold or supplemental input 34 positioned downstream of the extracorporeal disinfection device 14. The manifold 34 is configured to input at least one substance into the flow of blood flowing through the output tube 16. For example, if the system 10 includes the separator 31 described above, the manifold 34 may reintroduce the material/portion of the blood that was separated by the separator 31 into the flow of treated blood flowing through the output tube 16, as shown in FIG. 1. In such embodiments, the manifold 34 may be in fluid communication with the separator 31 via the diverter pathway 32 (e.g., a bypass tube or other passageway) that carries or contains a flow of the material separated from the flow of pre-treated/infected blood by the separator 31, as shown in FIG. 1.

In some embodiments, the manifold 34 may be in fluid communication with a supply of treatment or infusion material 35 configured to treat the treated/disinfected blood. The manifold 34 may thereby introduce the treatment material 35 into the flow of treated/disinfected blood flowing through the output tube 16. In one embodiment, the dose of light from the extracorporeal disinfection device 14 may degrade at least one constituent part or substance of the pre-treated/infected blood, and the treatment or infusion material 35 may comprise the at least one constituent part or component of the infected blood in a non-degraded state and/or comprises a substance that treats the degraded at least one constituent part or substance of the infected blood.

As also shown in FIG. 1, in some embodiments the disinfection system 10 and related methods include at least one air trap or air remover 33 configured to trap or otherwise remove or eliminate air and from the flow of blood. In one embodiment, the air trap 33 may be built into or attached to the input tubing 12, the extracorporeal disinfection device 14 and/or the output tubing 16. The at least one air trap or air remover 33 is configured to remove air or other gases from the flow of blood flowing through the system 10 such that the gas(es) do not reach the patient 11. The air trap or air remover 33 may be any mechanism or configuration effective is removing or otherwise preventing air or other gases from remaining within the flow of blood and, ultimately, flowing to the patient 11 in the flow of treated blood in the output tube 16. In some embodiments, the system 10 may include at least one air trap or air remover 33 downstream of the extracorporeal disinfection device 14, as shown in FIG. 1.

The extracorporeal disinfection device 14 may be configured in a variety of differing configurations that effectuate a dose of the light emitted by the microbicidal light emitting device 24 to the infected blood flowing through the treatment flowpath 22 that disinfects the blood, such as a dose that is effective in at least one of eliminating pathogenic microorganisms from the infected blood, partially reducing the number of the pathogenic microorganisms in the infected blood, and reducing the rate of proliferation of the pathogenic microorganisms in the infected blood, as described above.

Figure 3:
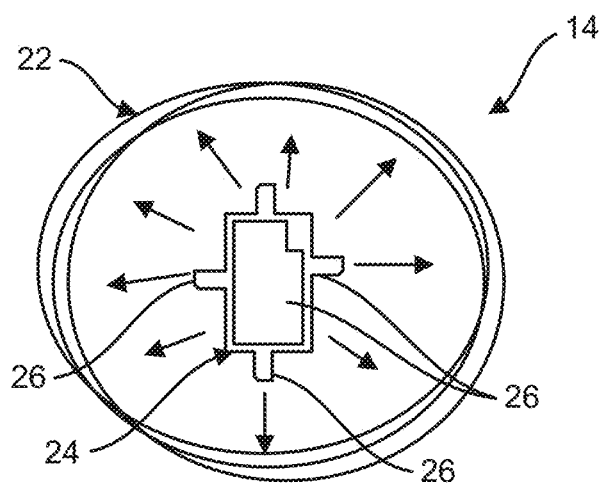
FIG. 3 is top view of a microbicidal light emitting device and treatment pathway of the extracorporeal blood disinfection system of FIGS. 1 and 2.
Figure 4:
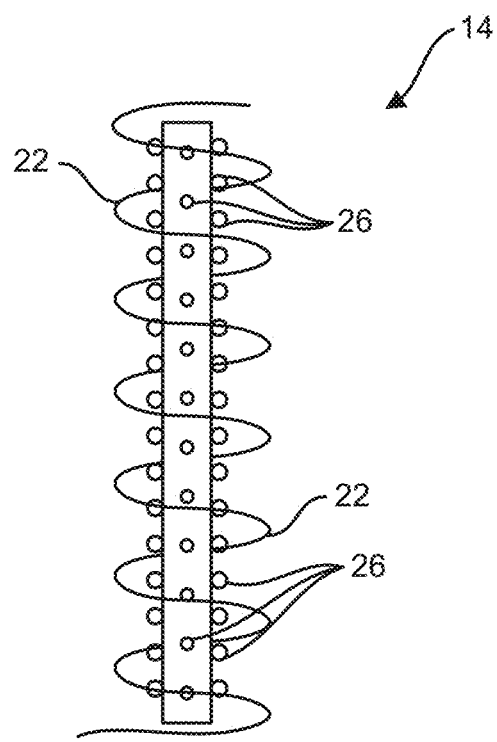
FIG. 4 is a side view of the light emitting device and treatment pathway of FIG. 3.

For example, as shown in FIGS. 3 and 4, in some embodiments the extracorporeal disinfection device 14 may comprise a translucent or transparent three-dimensional coil treatment flowpath 22 that extends at least partially about the microbicidal light emitting device 24. In some such embodiments, the coil treatment flowpath 22 may comprise a helical channel or tube that extends at least partially about the microbicidal light emitting device 24, as shown in FIGS. 3 and 4. The treatment flowpath 22 may thereby define a coiled channel or tube that extends along an axial or length direction (as opposed to a planar coil channel) about the microbicidal light emitting device 24.

As also shown in FIGS. 3 and 4, the microbicidal light emitting device 24 may comprise an emitter shaft that is elongated along an axial or length direction with a plurality of light emitting devices 26 provided about an axis of the emitter shaft and/or along the axial length of the emitter shaft. The emitter shaft and/or plurality of light emitting devices 26 are configured to emit light outwardly toward the coiled (e.g., helical) treatment flowpath 22 (and thereby incident on the flow of blood flowing through the treatment flowpath 22.

In some embodiments, the light emitting devices 26 are provided in a helical arrangement as shown in FIG. 4, which may (or may not) mimic, correspond or follow the path of the coiled (e.g., helical) treatment flowpath 22. However, the light emitting devices 26 may be provided in any regular or irregular arrangement on the emitter shaft. The arrangement and number of light emitting devices 26 of the emitter shaft are configured such that the blood flowing through the coiled (e.g., helical) treatment flowpath 22 receive an effective dose of light emitted therefrom, as explained above. In some embodiments, the light emitting devices 26 comprise a plurality LEDs provided on or otherwise coupled to the emitter shaft. In some such embodiments, the emitter shaft includes a thermal management device configured to cool the light emitting devices 26.

Figure 5:
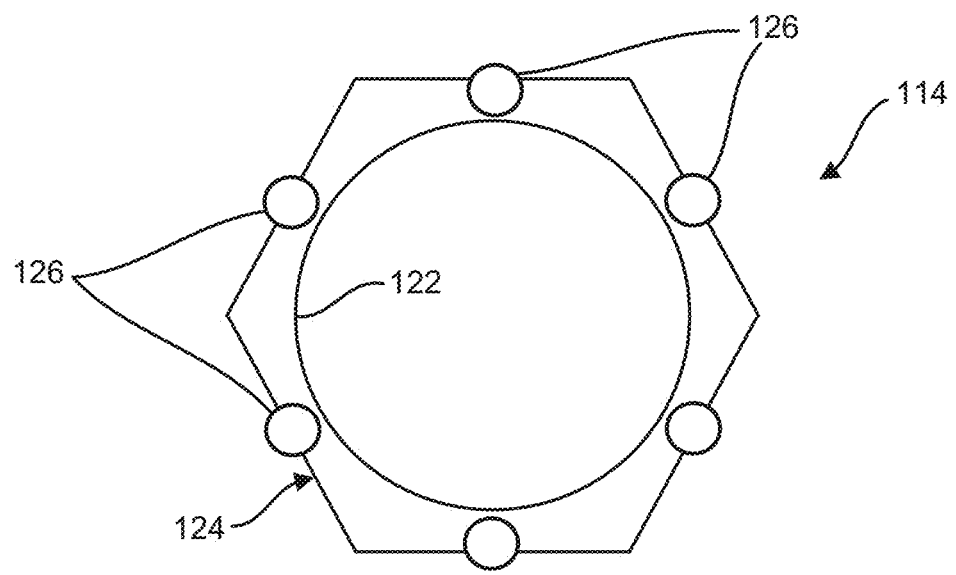
FIG. 5 is top view of a microbicidal light emitting device and treatment pathway of another extracorporeal blood disinfection system of the present disclosure.
Figure 6:
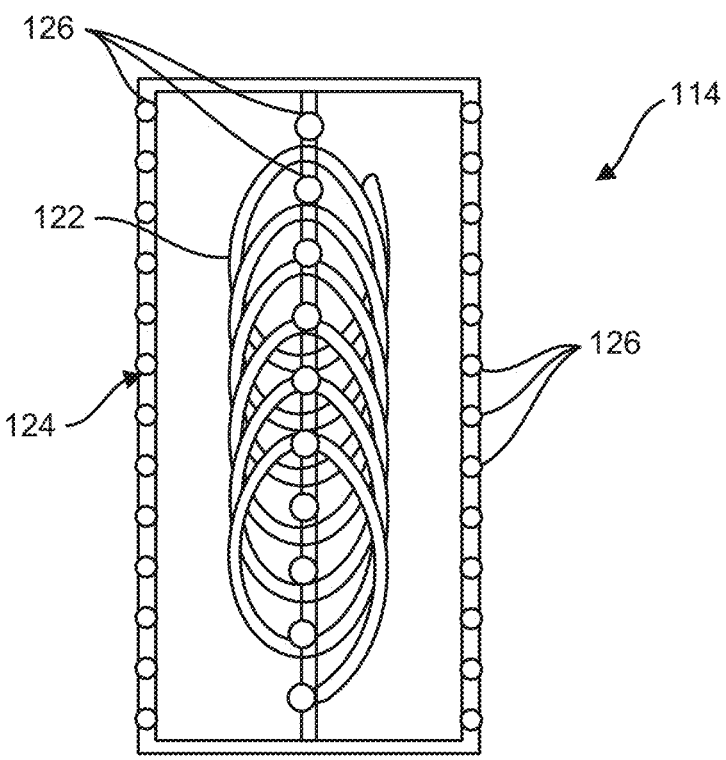
FIG. 6 is a side view of the light emitting device and treatment pathway of FIG. 5.

Another exemplary extracorporeal disinfection device 114 is illustrated in FIGS. 5 and 6. As shown in FIGS. 5 and 6, the extracorporeal disinfection device 114 is similar to the extracorporeal disinfection device 14 illustrated in FIGS. 4 and 5, but differs in that the coiled (e.g., helical) treatment flowpath 122 is provided at least partially within the microbicidal light emitting device 124. Stated differently, the microbicidal light emitting device 124 extends at least partially about the coiled (e.g., helical) treatment flowpath 122.

As shown in FIGS. 5 and 6, the microbicidal light emitting device 124 may comprise a hollow or open structure that is elongated along an axial or length direction, and the coiled (e.g., helical) treatment flowpath 122 is positioned at least partially within the internal cavity of the microbicidal light emitting device 124. The plurality of light emitting devices 126 of the microbicidal light emitting device 124 are provided in or face the internal cavity of the microbicidal light emitting device 124, and thereby the coiled (e.g., helical) treatment flowpath 122 (and thereby incident on the flow of blood flowing through the treatment flowpath 122), as shown in FIGS. 5 and 6. The plurality of light emitting devices 126 may thus be provided about and along the exterior of the coiled (e.g., helical) treatment flowpath 122.

In some embodiments, the open structure may be configured with internal mirrored or reflective surfaces or material that reflect the light emitted from the plurality of light emitting devices 126. The mirrored or reflective surfaces of the open structure may be configured to reflect the emitted from the plurality of light emitting devices 126 inwardly into the interior of the inner cavity and the coiled (e.g., helical) treatment flowpath 122 therein. In this way, light emitted from the plurality of light emitting devices 126 that passes or is not incident on the coiled treatment flowpath 122 may reflect off one or more of the mirrored or reflective surfaces and, ultimately, act on the treatment flowpath 122 (i.e., become incident on the flow of blood therethrough).

In some embodiments, the light emitting devices 126 are provided in a helical arrangement as shown in FIG. 6, which may (or may not) mimic, correspond or follow the path of the coiled (e.g., helical) treatment flowpath 122. However, the light emitting devices 126 may be provided in any regular or irregular arrangement. The arrangement and number of light emitting devices 126 on/in the open structure are configured such that the blood flowing through the coiled (e.g., helical) treatment flowpath 122 receive an effective dose of light emitted therefrom, as explained above. In some embodiments, the light emitting devices 126 comprise a plurality LEDs provided on or otherwise coupled to the open structure.

Figure 7:
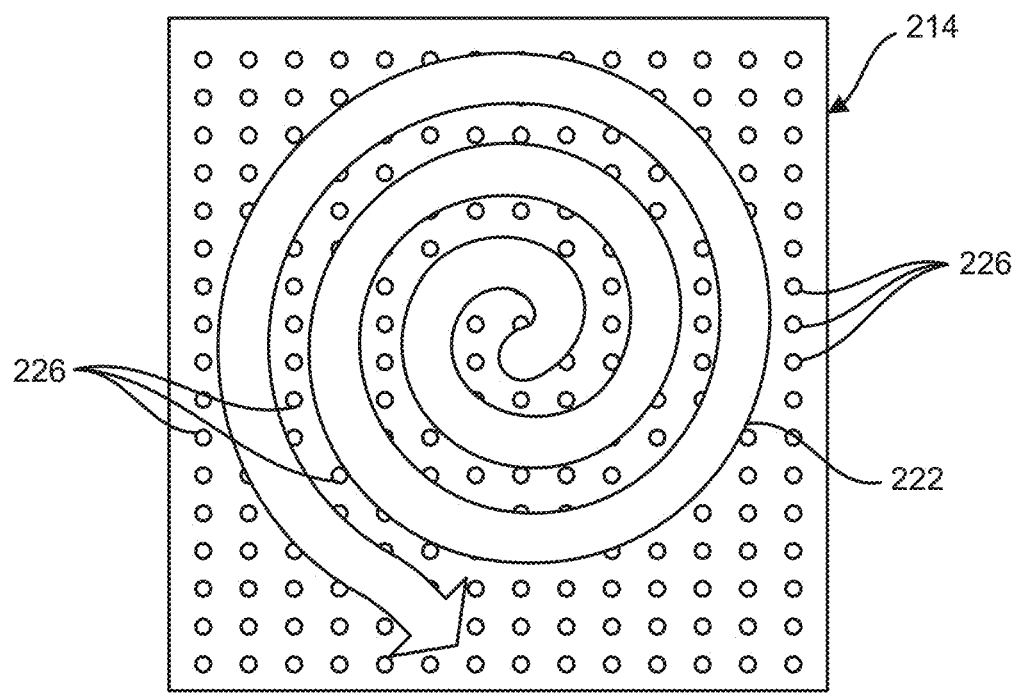
FIG. 7 is top view of a treatment pathway of another extracorporeal blood disinfection system of the present disclosure.
Figure 8:
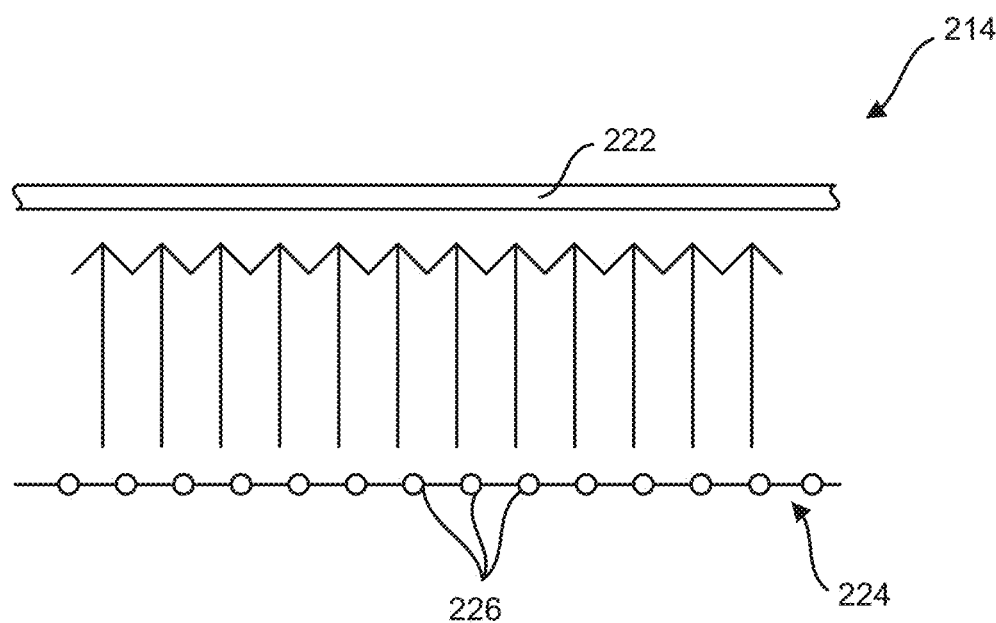
FIG. 8 is a side view of a microbicidal light emitting device and the light emitting device of FIG. 7.

Another exemplary extracorporeal disinfection device 214 is illustrated in FIGS. 7 and 8. As shown in FIGS. 7 and 8, the extracorporeal disinfection device 214 may comprise a translucent or transparent two-dimensional coil treatment flowpath 222 that extends adjacent to the microbicidal light emitting device 224. In some such embodiments, the coil treatment flowpath 22 may comprise a planar coiled channel or tube that extends adjacent to the microbicidal light emitting device 224, as shown in FIGS. 7 and 8. The treatment flowpath 222 may thereby define a flat or planar two-dimensional coiled channel or tube that extends along a width and thickness direction, but is flat or planar along an axial or length direction (as opposed to a three-dimensional or helical coil channel) positioned adjacent the microbicidal light emitting device 224 along the axial direction, as shown in FIGS. 7 and 8.

As also shown in FIGS. 7 and 8, the microbicidal light emitting device 224 may comprise an emitter plate that with a plurality of light emitting devices 226 that is positioned adjacent the two-dimensional coiled treatment flowpath 222 along the axial direction. In some embodiments, the emitter plate may be planar. The emitter plate and/or plurality of light emitting devices 226 are configured to emit light outwardly toward the two-dimensional coiled treatment flowpath 222 (and thereby incident on the flow of blood flowing through the treatment flowpath 222).

In some embodiments, the light emitting devices 226 are provided in a regular pattern ion the emitter plate, as shown in FIG. 7. However, the light emitting devices 226 may be provided in any regular or irregular arrangement on the emitter plate. The arrangement and number of light emitting devices 226 of the emitter plate are configured such that the blood flowing through the two-dimensional coiled treatment flowpath 222 receives an effective dose of light emitted therefrom, as explained above. In some embodiments, the light emitting devices 226 comprise a plurality LEDs provided on or otherwise coupled to the emitter plate. In some such embodiments, the emitter plate includes a thermal management device configured to cool the light emitting devices 226 and/or a reflective surface that is configured to reflect light emitted from the light emitting devices 226 to/toward the two-dimensional coiled treatment flowpath 222.

Figure 9:
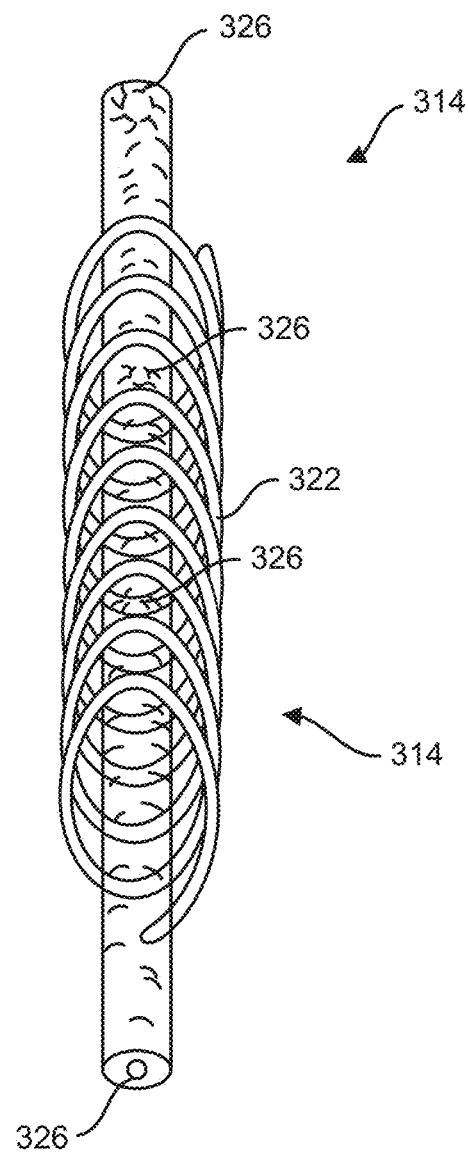
FIG. 9 is a perspective view of a microbicidal light emitting device and treatment pathway of another extracorporeal blood disinfection system of the present disclosure.

Another exemplary extracorporeal disinfection device 314 is illustrated in FIG. 9. As shown in FIG. 9, the extracorporeal disinfection device 314 is similar to the extracorporeal disinfection device 14 illustrated in FIGS. 4 and 5, but differs in that the light emitting devices 326 are positioned within the emitter shaft and/or are configured to emit light into the emitter shaft. Stated differently, the microbicidal light emitting device 324 comprises an emitter shaft that includes light emitting devices 326 that emit light within or into an interior of the emitter shaft, as shown in FIG. 9.

The emitter shaft may comprise a light pipe configured to direct the light from the emitted to the light emitting devices 326 to the coiled (e.g., helical) treatment flowpath 322 extending about the emitter shaft. In some embodiments, at least one light emitting devices 326 may be positioned at, proximate to, or within an end portion of the emitter shaft and emits light into and/or through the emitter shaft along the axis of the emitter shaft, as shown in FIG. 9. In some embodiments, at least one light emitting devices 326 may be positioned within the emitter shaft and emit light into and/or through the emitter shaft along the axis of the emitter shaft, as shown in FIG. 9. In such embodiments, the emitter shaft is configured to redirect the light emitted from the at least one light emitting device 326 in an outward radial direction extending away from the longitudinal axis of the emitter shaft, and thereby toward the coiled (e.g., helical) treatment flowpath 322 extending about and along the longitudinal axis of the emitter shaft.

Another embodiment of another extracorporeal blood disinfection system 410 with an extracorporeal disinfection device 414 according to the present disclosure is shown in FIGS. 10-14. As shown in FIGS. 10-14, the extracorporeal disinfection device 414 includes a folded channel treatment pathway 422 (see FIG. 12) extending between an inlet 422A portion and an outlet portion 422B for blood to pass through that is in fluid communication with the input and output tubes (not shown), respectively. The folded channel treatment pathway 422 is irradiated from one or both sides via the light emitting device 424, which may utilize LEDs as the light emitting device 426 of the microbicidal light emitting device 424.

As shown in FIGS. 10-14, the microbicidal light emitting device 424 may comprise a plurality or set of light emitting devices 426 (e.g., LEDs) on or associated with a printed circuit board 427 that powers and/or otherwise controls, at least in part, the light emitting devices 426. The light emitting devices 426 and the printed circuit board 427 may thereby be mechanically and electrically coupled. For example, the light emitting devices 426 may be provided on a face of the printed circuit board 427, as shown in FIGS. 10-14. The arrangement of the light emitting devices 426 is configured such that the light energy hitting the channel treatment pathway 422 is substantially uniform, while still achieving a target amount of total energy (i.e., dose), as described above.

Figure 10:
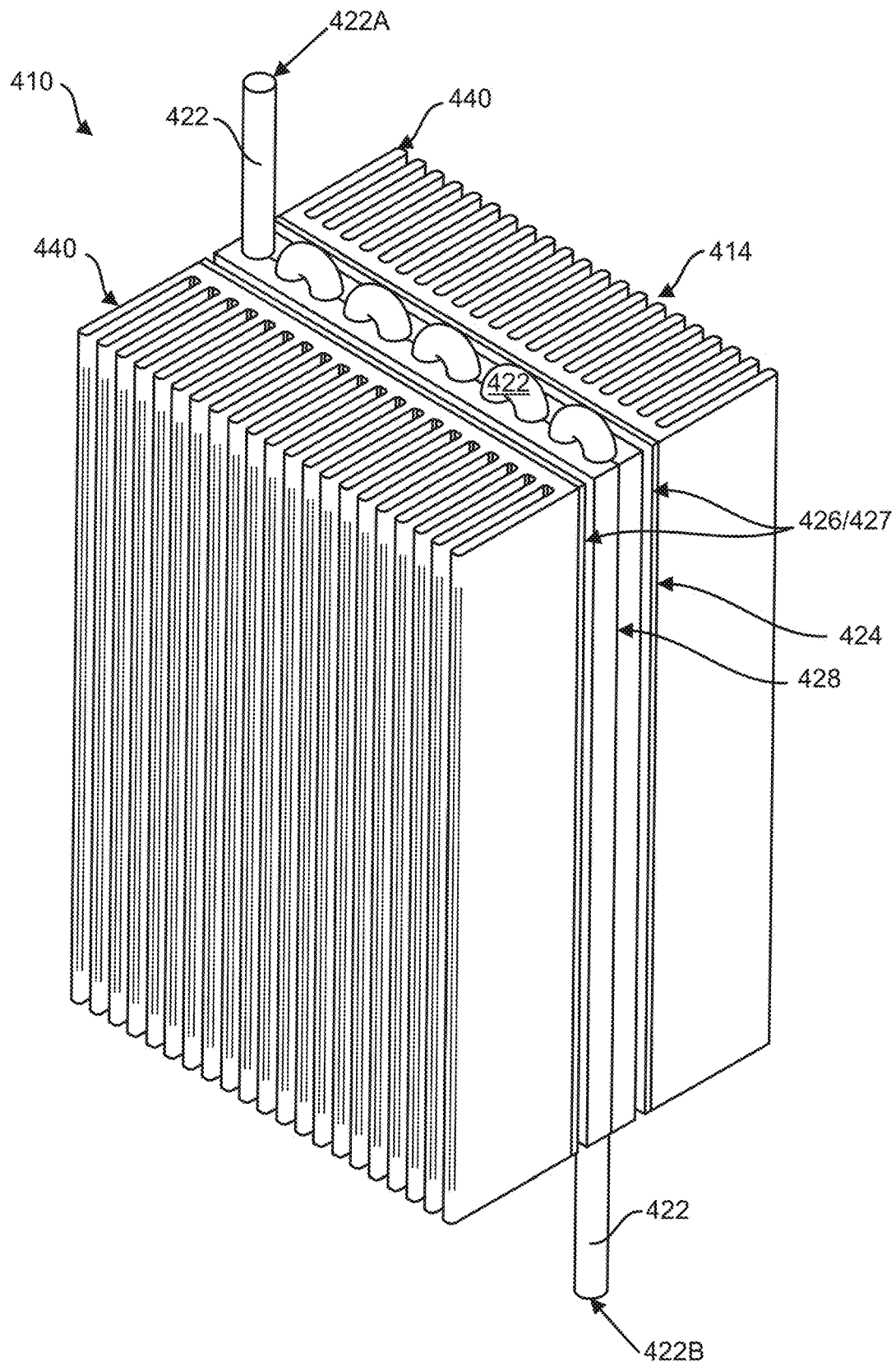
FIG. 10 is an elevational perspective view of a microbicidal light emitting device and treatment pathway of another extracorporeal blood disinfection system.
Figure 11:
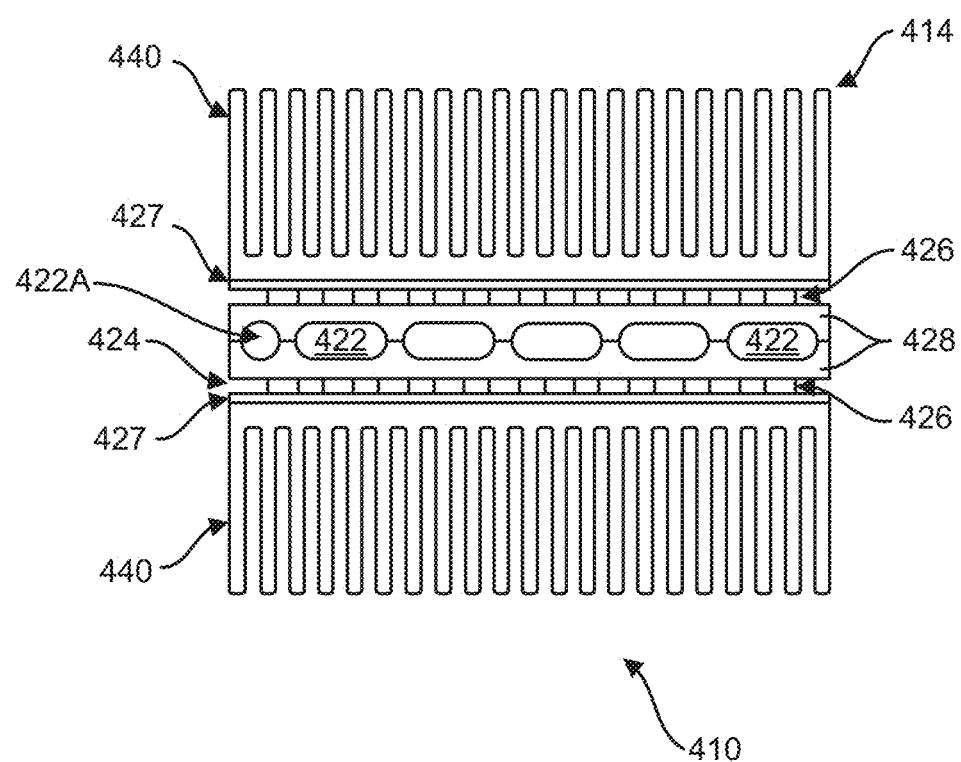
FIG. 11 is top view of the light extracorporeal blood disinfection system of FIG. 10.
Figure 12:
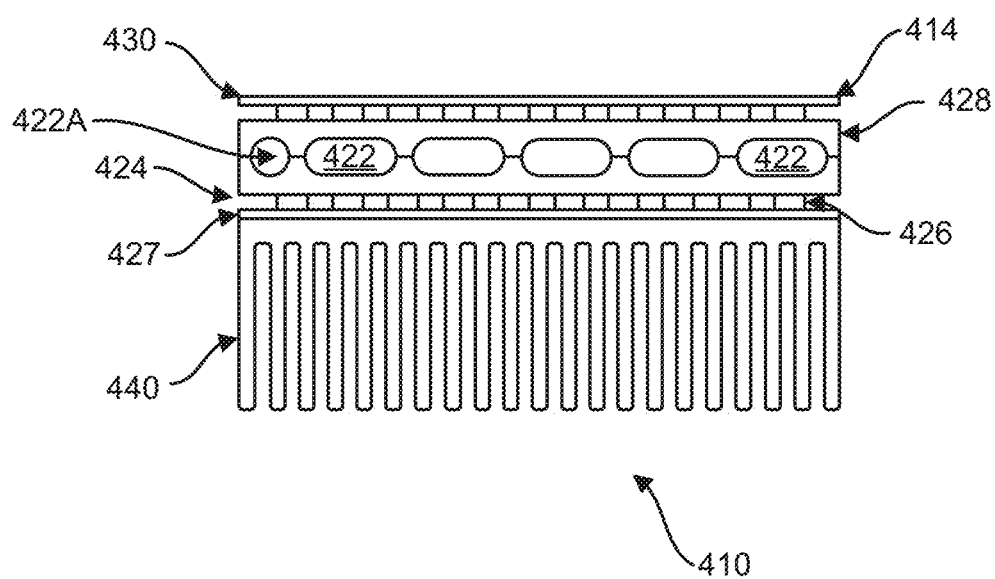
FIG. 12 is top view of a portion of the extracorporeal blood disinfection system of FIG. 10.
Figure 13:
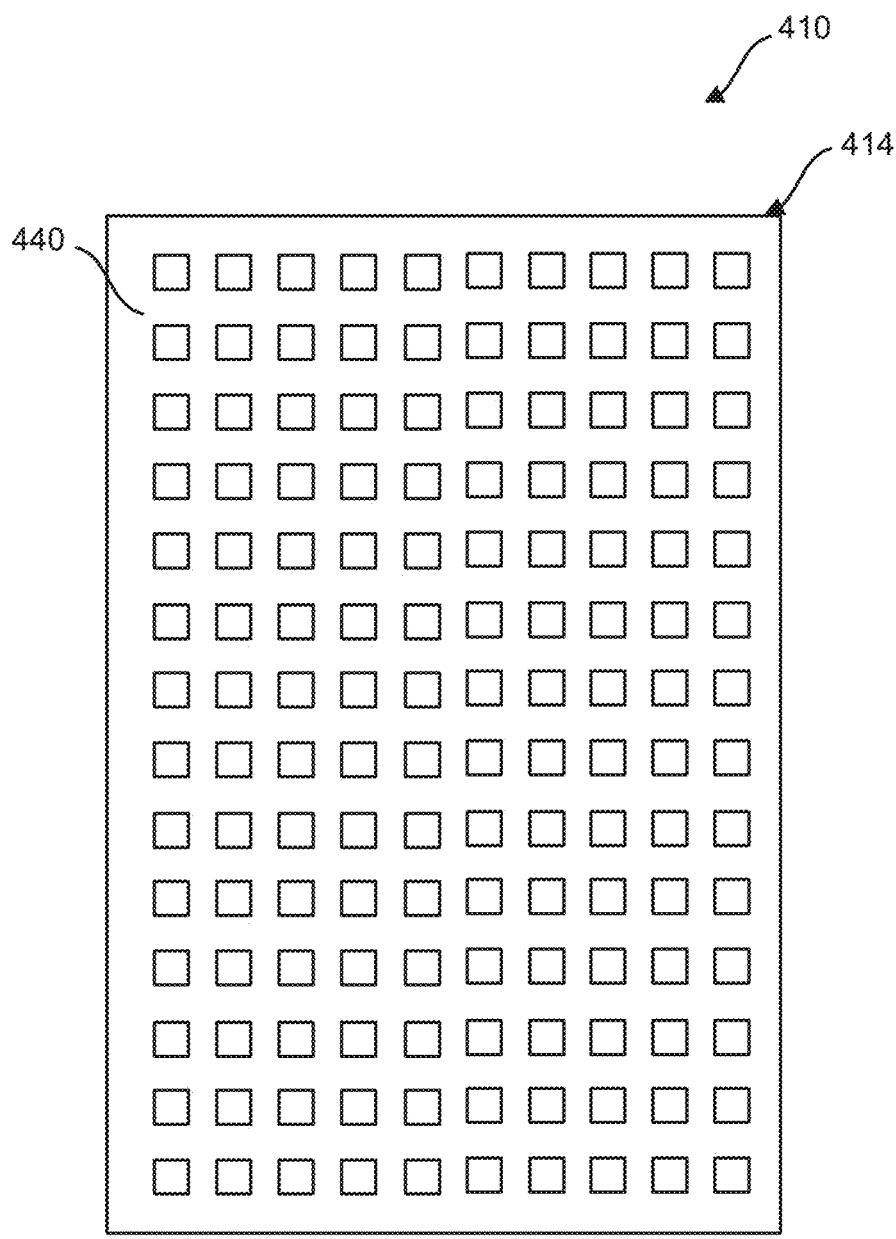
FIG. 13 is a side view of the extracorporeal blood disinfection system of FIG. 10.

In some embodiments, the printed circuit board 427 may be built on, incorporate or be coupled to a thermally conductive substrate 440 (e.g., a metal or ceramic substrate) to enhance thermal conduction of the circuit board 437 (which may be or comprise fiberglass, for example) and/or the light emitting devices 426, as shown in FIGS. 10-13. The increased thermal conduction and/or convection provided by the substrate 440 may allow for a greater amount of energy to be utilized without overheating the blood in the channel treatment pathway 422. As shown in FIGS. 10-12, in some embodiments the substrate 440 may comprise one or more heatsinks or other thermal management devices that dissipate heat from the printed circuit board 427 and/or the light emitting devices 426, such as from the light emitting devices 426 through the associated circuit board 427. These thermal management devices could comprise one or more heatsink, heat spreader, phase change heat pipe, fan, Peltier cooling mechanism, water cooling mechanism, liquid cooling mechanism, thermal interface material, synthetic jet air cooling device, electrostatic fluid acceleration (EFA) air cooling mechanism, compressed air cooling mechanism, radiator, or other device or cooling technique (alone or in combination) configured to maintain the light emitting devices within a specified operating temperature range. In some embodiments, one or more fan may be used to force air over a substrate 440 to enhance its ability to dissipate heat from the printed circuit board 427 and/or the light emitting devices 426.

In some embodiments, the extracorporeal disinfection device 414 includes an optical diffuser 428 associated with the microbicidal light emitting device 424, as shown in FIGS. 10-12. The optical diffuser 428 is configured to scatter the light emitted from the at least one light emitting device 426 such that the emitted light incident on the infected blood within the treatment flowpath 422 is of a substantially uniform intensity. In some embodiments, the optical diffuser 428 may comprise one or more polymeric components, and may be configured to scatter light from the LEDs or other irradiation source of the at least one light emitting device 326 to form a substantially uniform intensity on the treatment flowpath 422. The optical diffuser 428 may function through use of aggregate scattering materials within or on the polymer, surface microstructures that scatter the light, molded lens features, for example, or other mechanisms that effectively alter the direction of light emitted from the at least one light emitting device 426.

Figure 14:
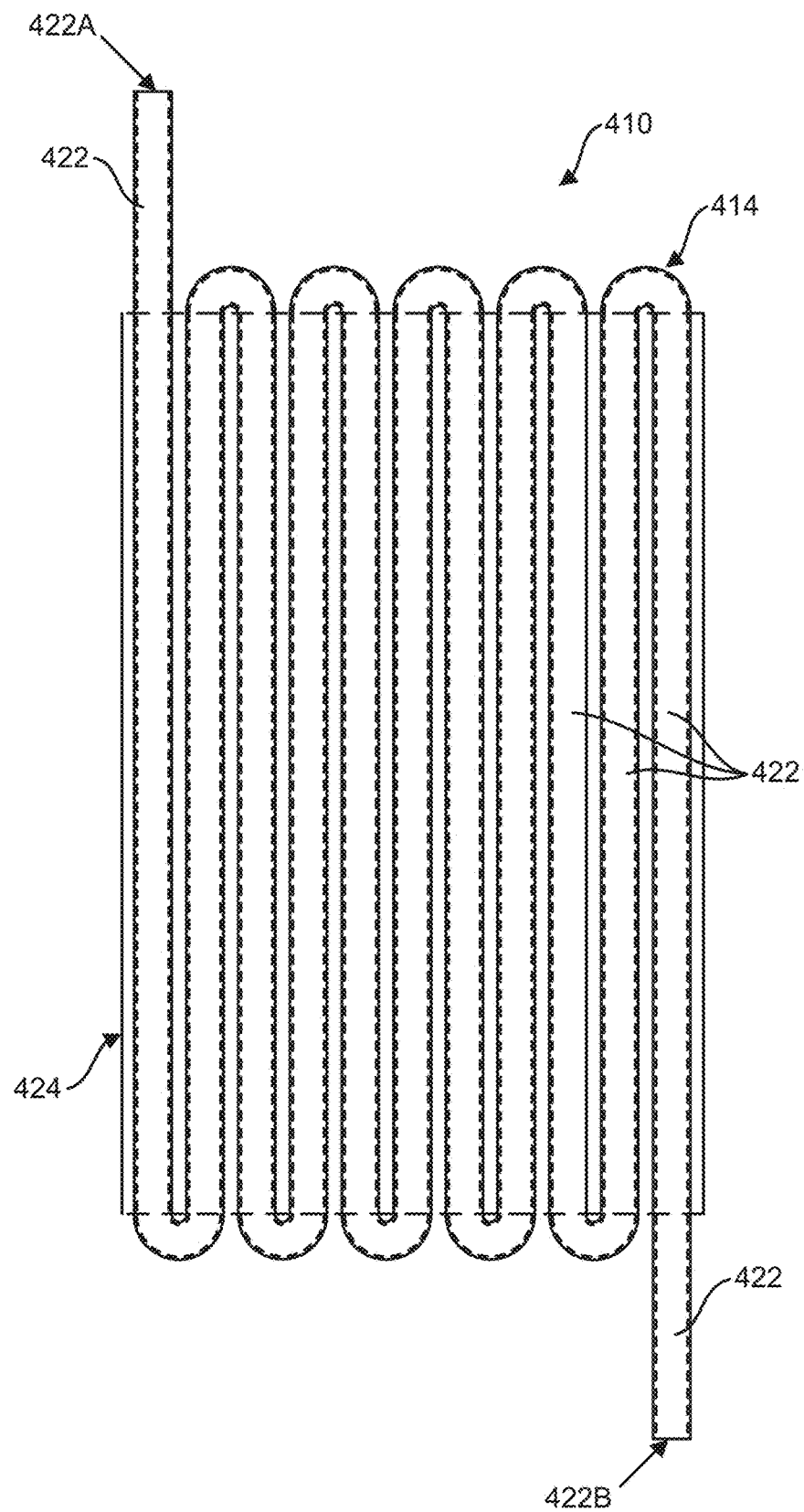
FIG. 14 is a side view of the treatment pathway of the extracorporeal blood disinfection system of FIG. 10.

In some embodiments, the treatment flowpath channel 422 may be irradiated from two or more sides via the microbicidal light emitting device 424. For example, the extracorporeal disinfection device 414 may include a pair of microbicidal light emitting devices 424 on two sides (e.g., opposing sides) of the treatment flowpath channel 422, as shown in FIGS. 10 and 11. In some other embodiments, the treatment flowpath channel 422 may be irradiated from only one side via the, as shown in FIG. 14. In such embodiments, a reflector 430 may be used on the side void of the microbicidal light emitting device 424/at least one light emitting device 426, as shown in FIG. 14, in order to reflect stray light back into/to/toward the treatment flowpath channel 422 and/or to improve uniformity of irradiation to the flow of blood therethrough.

Figure 15:
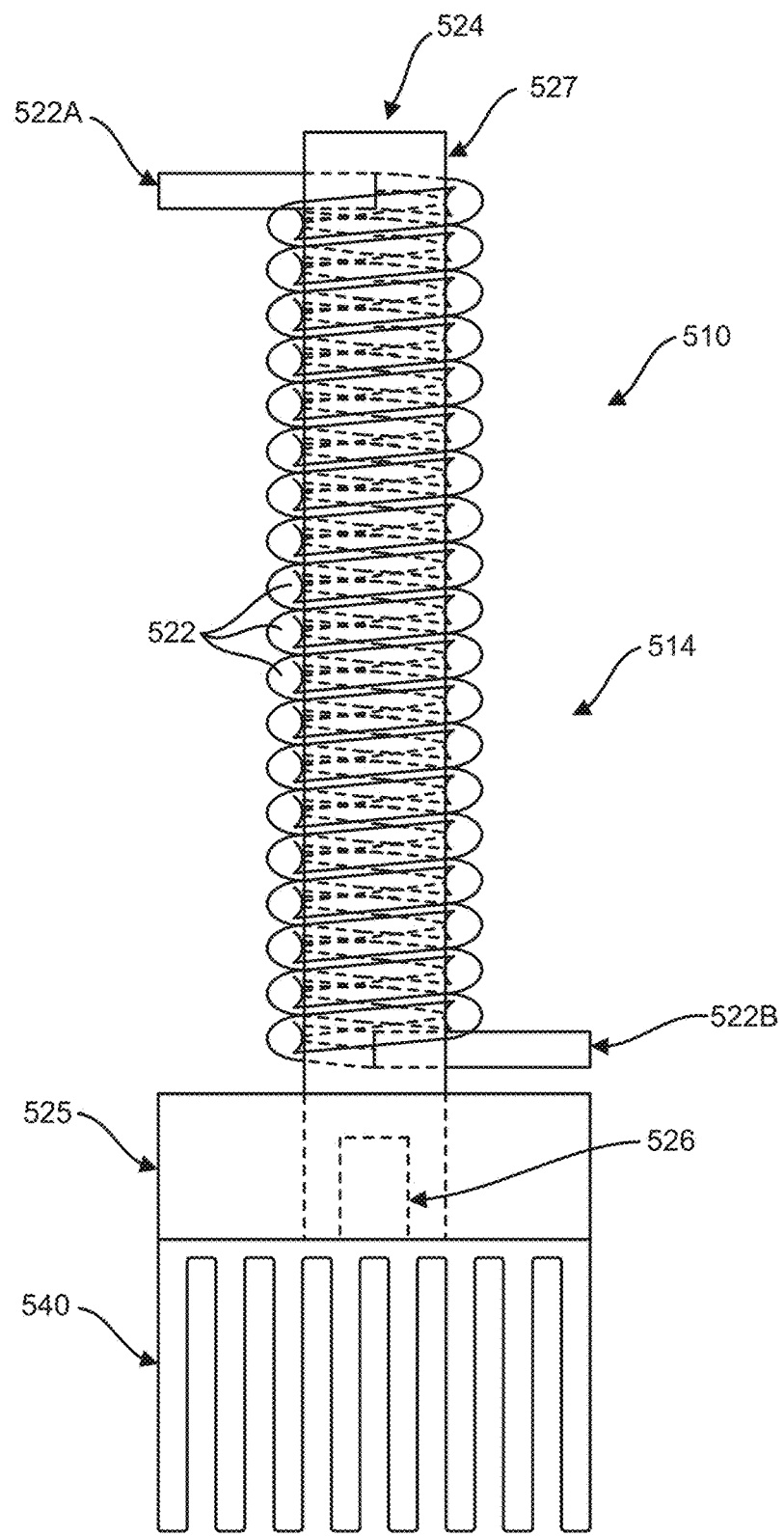
FIG. 15 is a side partial cross-sectional view of a microbicidal light emitting device and treatment pathway of another extracorporeal blood disinfection system.
Figure 16:
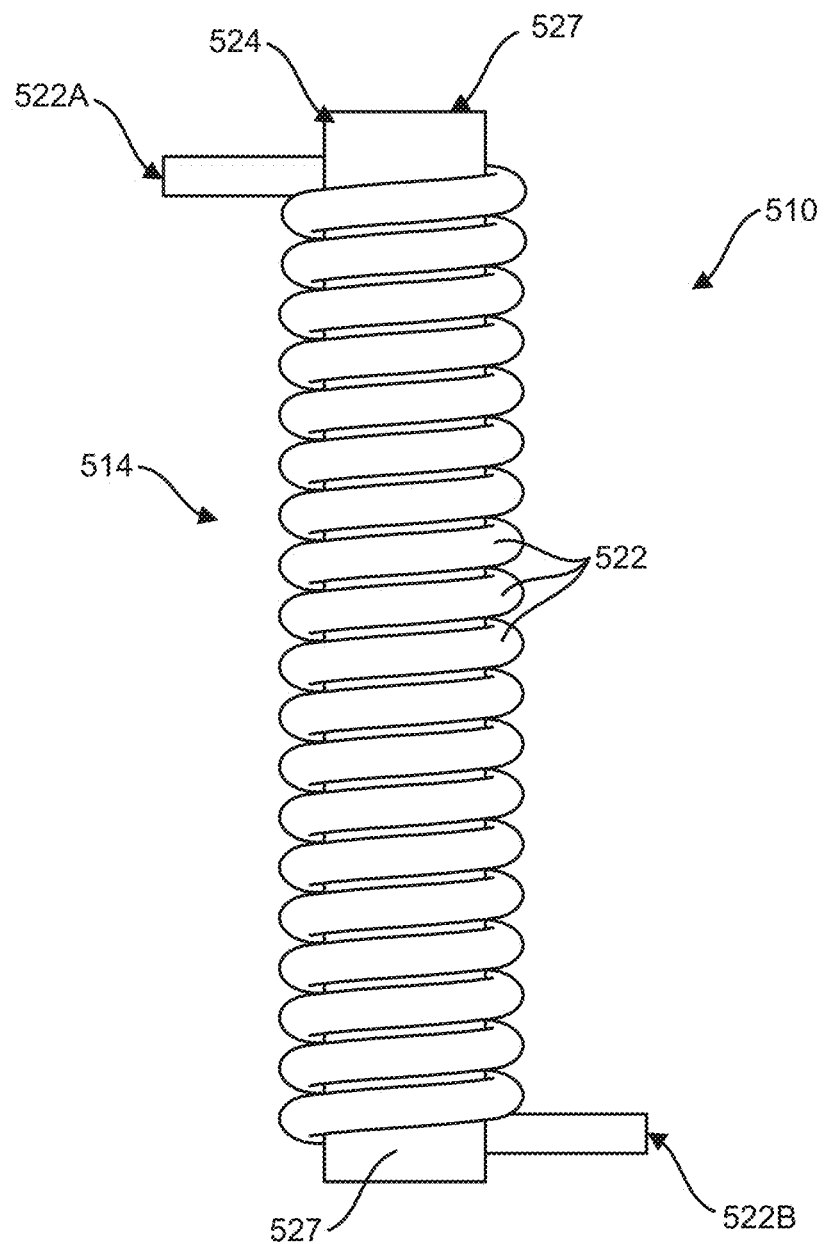
FIG. 16 is a side view of a portion of the treatment pathway and emitter shaft of the light emitting device of FIG. 15.

Another embodiment of another extracorporeal blood disinfection system 510 with an extracorporeal disinfection device 514 according to the present disclosure is shown in FIGS. 15 and 16. As shown in FIGS. 15 and 16, in some embodiments, the microbicidal light emitting device 524 of the extracorporeal disinfection device 514 comprises an emitter shaft 527 that is partially surrounded by a helical coiled treatment pathway 522 extending between an inlet portion 522A and an outlet portion 522B for the flow of the blood therethrough.

In some embodiments, the emitter shaft 527 may include a central thermal management device. The emitter shaft 527 may be surrounded with outward facing light emitting device 526 as described above with respect to FIGS. 3 and 4. In some other embodiments, the emitter shaft 527 may comprise a light-pipe or other optical element configured to redirect light emitted axially therein/therethrough via at least one light emitting device 526 (e.g., LED) to and through the outer surface of the emitter shaft 527 (i.e., radially) and, ultimately, to the helical coiled treatment pathway 522, as shown in FIG. 15. In such a configuration, at least one light emitting device 526 may be located at one or both ends of the emitter shaft 527. In some embodiments, the light-pipe may comprise a polymeric cylinder or cone, with features such as lenses, ridges, or texture that scatter the light emitted into the emitter shaft 527 outwards toward the helical coiled treatment pathway 522.

The at least one light emitting device 526 may thereby be positioned at an axial end portion of the emitter shaft 527, as shown in FIG. 15. As shown in FIGS. 15 and 16, the helical coiled treatment pathway 522 may be positioned along an opposite end portion and/or medial portion of the emitter shaft 527 than the at least one light emitting device 526 such that the treatment pathway 522 is spaced from the end portion of the emitter shaft 527 including the at least one light emitting device 526 (i.e., axially spaced from the at least one light emitting device 526).

It is noted that the location of the at least one light emitting device 526 at the end of the emitter shaft 527 spaced from the helical coiled treatment pathway 522 limits or attenuates the amount of incidental conduction of thermal energy into the blood flowing through the helical coiled treatment pathway 522 channel from the at least one light emitting device 526. To further limit or prevent the ability or effect of the at least one light emitting device 526 from heating up the blood flowing through the helical coiled treatment pathway 522, the extracorporeal disinfection device 514 may include a thermal management device (for example, a heatsink) 540 coupled to the at least one light emitting device 526 to remove heat therefrom, as shown in FIG. 15. An optical chamber housing 525 may be positioned surrounding the exposed portions of the light emitting device. This housing may serve to prevent light from the light emitter from leaving the device, reflect light back in to the emitter shaft, prevent exposure of the emitter shaft to external light sources, and may also provide a mechanical connection between the light emitting device, optional thermal management device, and emitter shaft.

Figure 17:
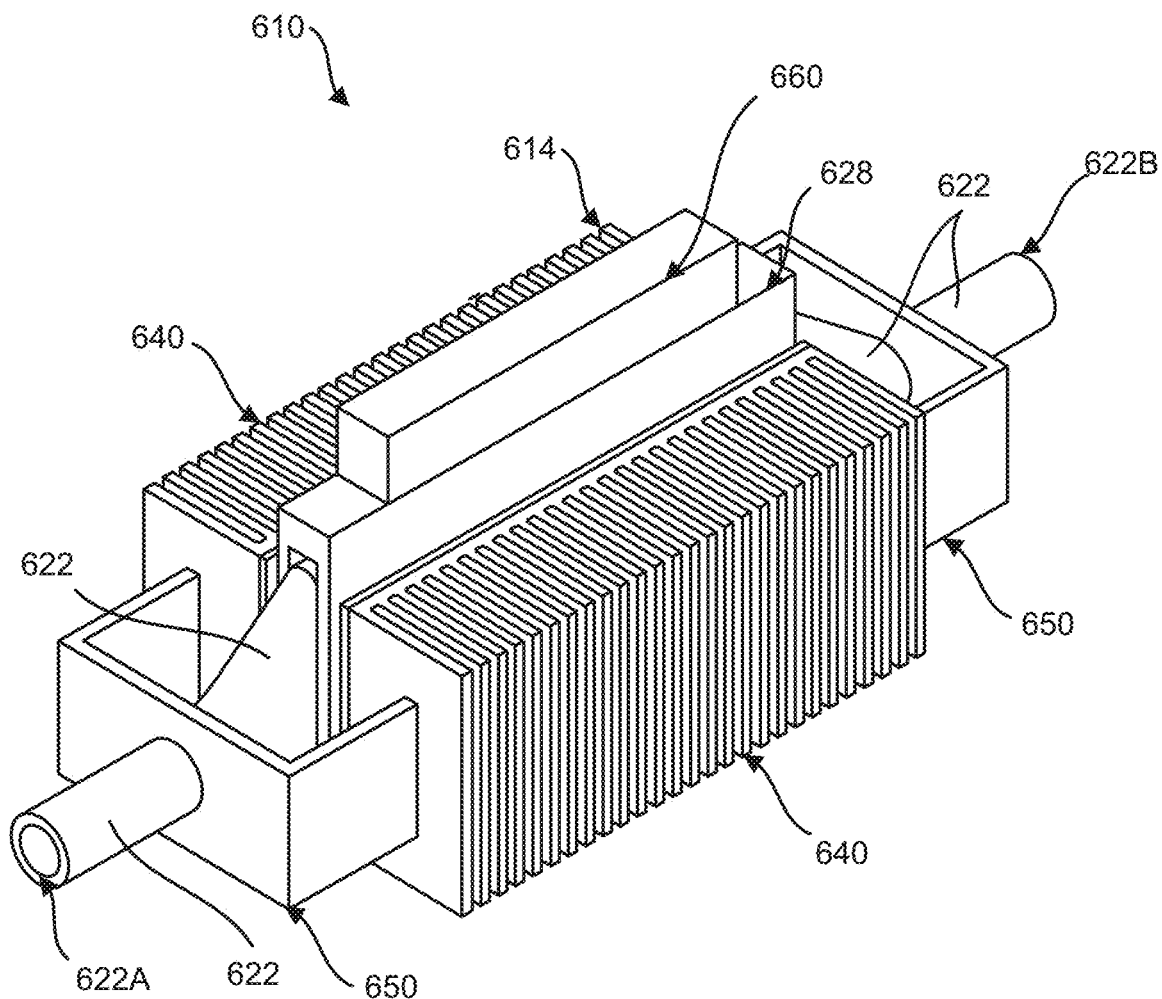
FIG. 17 is an elevational perspective view of a microbicidal light emitting device and treatment pathway of another extracorporeal blood disinfection system.
Figure 18:
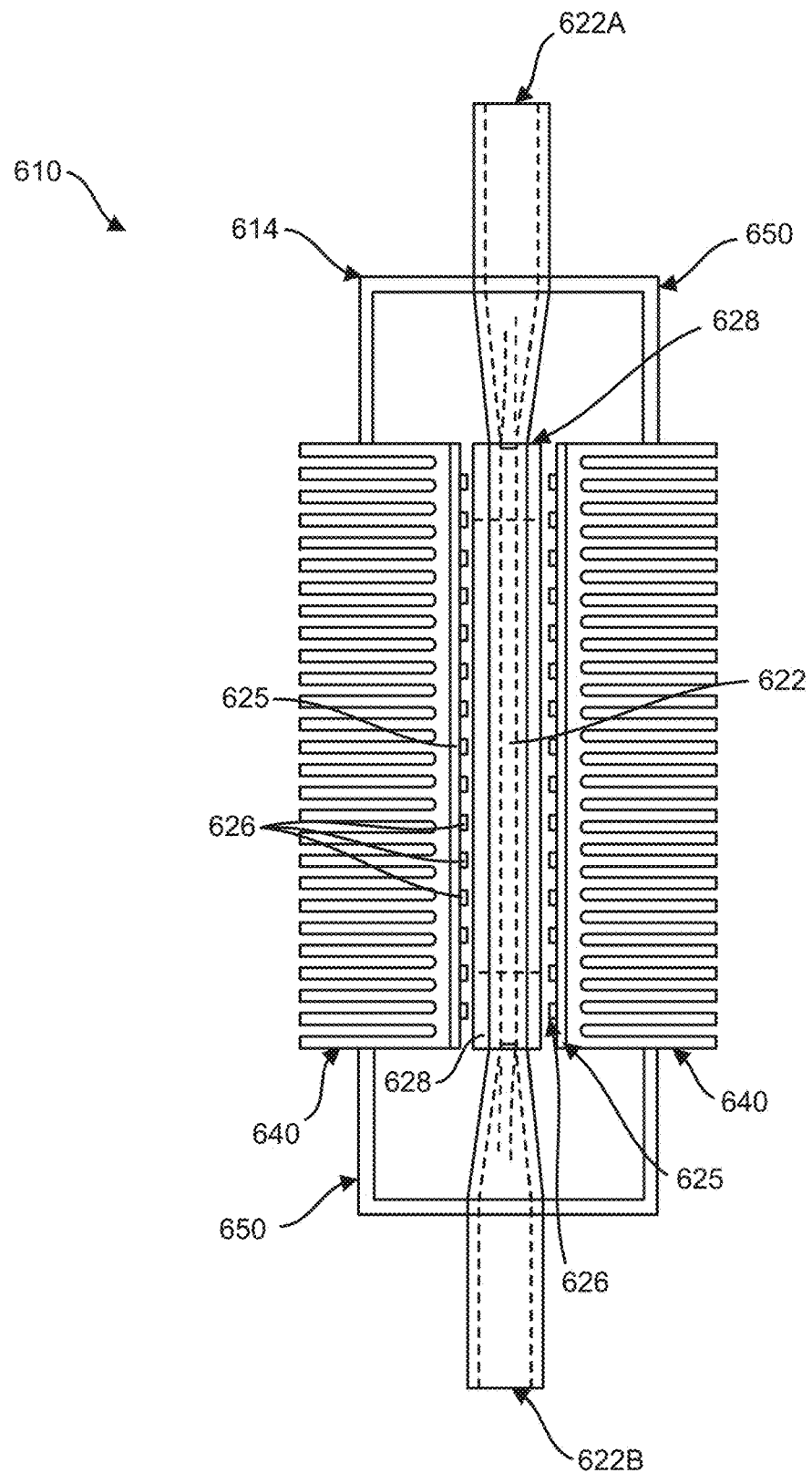
FIG. 18 is a cross-sectional view of the light emitting device and treatment pathway of FIG. 17.

Another embodiment of another extracorporeal blood disinfection system 610 with an extracorporeal disinfection device 614 according to the present disclosure is shown in FIGS. 17 and 18. As shown in FIG. 18, the blood disinfection system 610 may include a support bracket 650 that physically supports the extracorporeal disinfection device 614 (and potentially a treatment pathway 622). For example, as shown in FIGS. 17 and 18, the support bracket 650 may physical support and arrange a printed circuit board 625 with a plurality of light emitting devices 626 (e.g., LEDs) and at least one thermal management device (for example, a heatsink) 640 with respect to the treatment pathway 622, as described above.

As shown in FIG. 18, the treatment pathway or channel 622 of the extracorporeal disinfection device 614 includes a flat or narrow portion extending between an inlet portion 622A and an outlet portion 622B for the flow of blood therethrough. The narrow portion of the treatment pathway 622 may be formed of a flexible material, such as medium or hard durometer silicone for example. As shown in FIG. 18, the narrow portion of the treatment pathway 622 may include flattened or thin portion that forms a narrow irradiation chamber as compared to an input and/or output portion of the treatment pathway 622. The narrow portion of the treatment pathway 622 may thereby be narrower/thinner in one dimension or axis as compared to the input and/or output portion of the treatment pathway 622, but larger in one or more other dimension or axis such that the cross-sectional areas thereof are the same or similar. In this way, the overall fluidic flow through the treatment pathway 622 may not be affected, or significantly affected, by the narrow portion. In some embodiments, the treatment pathway 622 (e.g., the narrow/flat portion thereof) may include internal elements to reduce turbulence and to ensure even flow across the wide and/or thin dimensions portions of the narrow portion of the treatment pathway 622.

In some embodiments, as shown in FIG. 17, the extracorporeal disinfection device 614 may include an optical diffuser 628 as described above. The optical diffuser 628 may be positioned proximate to the narrow portion of the treatment pathway 622, as shown in FIG. 17. For example, the optical diffuser 628 may be directly coupled to at least a portion of the narrow portion of the treatment pathway 622.

As shown in FIG. 17, in some embodiments the extracorporeal blood disinfection device 614 may include an ultrasonic transducer or emitter 660. The ultrasonic transducer 660 is configured to produce, conduct and/or provide ultrasonic motion. The ultrasonic transducer 660 may improve efficacy of the extracorporeal disinfection device 614, and thereby the system 610 as a whole, as compared to without the ultrasonic transducer 660. As shown in FIG. 17, the ultrasonic transducer 660 may be coupled to the optical diffuser 628, such that the diffuser 628 serves to transmit ultrasonic motion from the ultrasonic transducer 660 to the narrow portion of the treatment pathway 622, for example. The flexibility of the treatment pathway 622 may allow for the narrow portion of the treatment pathway 622 to move relative to the other (potentially fixed) components of the extracorporeal disinfection device 614/system 610.

The ultrasonic transducer 660 may thereby be configured to provide ultrasonic agitation to at least the narrow portion of the treatment pathway 622, which may act to decrease blood clot formation within the narrow portion, which may enable the use of a thinner narrow portion and, thereby, improve irradiation of the blood flowing therethrough (as the surface area of the blood exposed to the disinfecting light can be increased), for example. The ultrasonic agitation provided by the ultrasonic transducer 660 may also aid in the destruction or elimination of microorganisms, such as when an antibiotic drug is present in the blood flowing through the treatment pathway 622. For example, the ultrasonic agitation may increase the effectiveness of antibiotics by increasing the rate of antibiotic transport to the bacteria and/or increase the permeability of the cell membrane of microorganisms within the blood flowing through the treatment pathway 622, for example. In some embodiments, the ultrasonic transducer may be configured to provide ultrasonic agitation to the narrow portion of the treatment pathway 622, and/or to the blood flowing through the narrow portion of the treatment pathway 622, at a frequency within the range of about 20 kHz and about 500 kHz.

Terminology used herein is for the purpose of describing particular examples only and is not intended to be limiting. As used herein, the singular forms "a", "an" and "the" are intended to include the plural forms as well, unless the context clearly indicates otherwise. Furthermore, references to "one example" are not intended to be interpreted as excluding the existence of additional examples that also incorporate the recited features. Moreover, unless explicitly stated to the contrary, the terms "comprising" (and any form of "comprise," such as "comprises" and "comprising"), "have" (and any form of "have," such as "has" and "having"), "include" (and any form of "include," such as "includes" and "including"), and "contain" (and any form of "contain," such as "contains" and "containing") are used as open-ended linking verbs. As a result, any examples that "comprises," "has," "includes" or "contains" one or more step or element possesses such one or more step or element, but is not limited to possessing only such one or more step or element. As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be." As used herein, the terms "comprising," "has," "including," "containing," and other grammatical variants thereof encompass the terms "consisting of" and "consisting essentially of."

The phrase "consisting essentially of" or grammatical variants thereof when used herein are to be taken as specifying the stated features, integers, steps or components but do not preclude the addition of one or more additional features, integers, steps, components or groups thereof but only if the additional features, integers, steps, components or groups thereof do not materially alter the basic and novel characteristics of the claimed compositions or methods.

All publications cited in this specification are herein incorporated by reference as if each individual publication were specifically and individually indicated to be incorporated by reference herein as though fully set forth.

Subject matter incorporated by reference is not considered to be an alternative to any claim limitations, unless otherwise explicitly indicated.

Where one or more ranges are referred to throughout this specification, each range is intended to be a shorthand format for presenting information, where the range is understood to encompass each discrete point within the range as if the same were fully set forth herein.

While several aspects and embodiments of the present disclosure have been described and depicted herein, alternative aspects and embodiments may be affected by those skilled in the art to accomplish the same objectives. Accordingly, this disclosure and the appended claims are intended to cover all such further and alternative aspects and embodiments as fall within the true spirit and scope of the disclosure.

We claim:

1. An extracorporeal blood disinfection system, comprising:
   an input tube forming a flowpath for the flow of infected blood from a mammalian patient;
   a disinfection unit, comprising:
     a microbicidal light emitting device configured to emit visible light;
     a treatment flowpath in communication with the input tube that is substantially transparent to the emitted light of the microbicidal light emitting device for receiving at least a portion of the flow of the infected blood therethrough; and
     at least one thermal management device configured to dissipate heat such that the microbicidal light emitting device is prevented from overheating the blood within the treatment pathway above a predefined temperature,
     wherein the microbicidal light emitting device effectuates a dose of the emitted visible light to the infected blood flowing through the treatment flowpath to disinfect the blood, the dose of visible light consisting essentially of visible light within the range of about 380 nm to about 425 nm and visible light within the range about 500 nm to about 700 nm effective to at least one of: eliminate pathogenic microorganisms in the infected blood; reduce the number of the pathogenic microorganisms in the infected blood; and reduce the rate of proliferation of the pathogenic microorganisms in the infected blood, and wherein the pathogenic microorganisms in the infected blood comprise at least one of bacteria, fungi, yeast and a combination thereof;

an output tube in fluid communication with the treatment flowpath forming a flowpath for the flow of the disinfected blood from the disinfection unit back to the patient; and a pump configured to at least one of:
provide the flow of infected blood from the patient through the input tube;
pass the blood from the input tube through the treatment flowpath; and
provide the flow of disinfected blood to the patient through the output tube.

2. The system according to claim 1, wherein the dose of the emitted visible light consists essentially of visible light within the range of about 380 nm to about 420 nm and visible light within the range about 615 nm to about 700 nm.

3. The system according to claim 1, further comprising an ultrasonic transducer configured to agitate at least the infected blood flowing through the treatment flowpath at a frequency within the range of about 20 kHz to about 500 KHz.

4. The system according to claim 1, wherein the pump is configured to:
provide the flow of infected blood from the patient through the input tube;
pass the blood from the input tube through the treatment flowpath; and
provide the flow of disinfected blood to the patient through the output tube.

5. The system according to claim 1, further comprising at least one filter configured to filter out at least one substance from at least one of the infected blood and the disinfected blood.

6. The system according to claim 5, wherein the at least one filter is configured to filter out at least one constituent part or substance of the disinfected blood that has become degraded due to the dose of the emitted light and microorganisms in at least one of the infected blood and the disinfected blood.

7. The system according to claim 1, further comprising a separator that separates at least one constituent part of the infected blood upstream of the treatment flowpath.

8. The system according to claim 7, wherein the separator separates at least one of plasma, white blood cells, and red blood cells from the infected blood.

9. The system according to claim 7, wherein the treatment flowpath receives a flow of the at least one separated constituent part of the infected blood.

10. The system according to claim 7, further comprising a manifold that combines the separated constituent parts of the blood prior to flowing back to the patient.

11. The system according to claim 1, further comprising at least one infusion component that introduces at least one substance into the disinfected blood.

12. The system according to claim 11, wherein the dose of emitted light degrades at least one constituent part or substance of the infected blood, and wherein the at least one substance introduced into the disinfected blood comprises at least one of: at least one blood component that corresponds to the at least one constituent part or component of the infected blood in a non-degraded state; and, a substance that treats the degraded at least one constituent part or substance of the infected blood.

13. The system according to claim 1, wherein the treatment flowpath comprises a translucent coil extending about the microbicidal light emitting device.

14. The system according to claim 1, wherein the disinfection unit further comprises an optical diffuser associated with the microbicidal light emitting device configured to scatter the emitted light such that the emitted light incident on the infected blood within the treatment flowpath is of a substantially uniform intensity.

15. The system according to claim 1, wherein the disinfection unit further comprises a reflector configured to reflect emitted light such that it is incident to the infected blood.

16. The system according to claim 1, wherein the at least one thermal management device is associated with the microbicidal light emitting device and configured to dissipate heat from the microbicidal light emitting device to maintain the temperature of at least a portion thereof such that the microbicidal light emitting device is prevented from overheating the blood within the treatment pathway above the predefined temperature.

17. The system according to claim 1, wherein the treatment flowpath comprises a folded channel.

18. The system according to claim 1, wherein the treatment flowpath comprises a channel extending along a plane.

19. The system according to claim 1, wherein the disinfection unit comprises an emitter shaft that defines a longitudinal axis, and wherein the treatment flowpath comprises a coiled channel that extends about the longitudinal axis.

20. The system according to claim 19, wherein the microbicidal light emitting device comprises a plurality of light emitting diodes provided on the emitter shaft, and wherein the emitter shaft includes the at least one thermal management device configured to cool the light emitting diodes.

21. The system according to claim 19, wherein the emitter shaft comprises a light pipe configured to direct the emitted light to the treatment pathway, and wherein the microbicidal light emitting device comprises at least one light emitting device positioned at an end of the emitter shaft that emits light into and/or through the emitter shaft.

22. The system according to claim 21, wherein the at least one light emitting device emits light along a longitudinal axis of the emitter shaft, and wherein the emitter shaft redirects the light emitted from the at least one light emitting device in an outward direction extending away from the longitudinal axis.

23. The system according to claim 1, wherein the microbicidal light emitting device comprises a plurality of light emitting diodes.

24. The system according to claim 23, wherein the light emitting diodes are provided on at least one printed circuit board, and wherein the disinfection unit further comprises the at least one thermal management device coupled to the at least one printed circuit board configured to dissipate heat generated by the light emitting diodes.

25. A method of extracorporeally selectively disinfecting blood of a mammalian patient, comprising:
utilizing the system according to claim 1 to disinfect the blood, comprising:
drawing a flow of infected blood from the mammalian patient via the at least one input tube;
passing at least a portion of the infected blood through the disinfection unit; and
reintroducing the disinfected blood from the disinfection unit back into the patient via the at least one output tube.

* * * * *